United States Patent
Batruni

(10) Patent No.: US 7,869,550 B2
(45) Date of Patent: Jan. 11, 2011

(54) NONLINEAR DIGITAL SIGNAL PROCESSOR

(75) Inventor: Roy G. Batruni, Danville, CA (US)

(73) Assignee: Optichron, Inc., Fremont, CA (US)

(*) Notice: Subject to any disclaimer, the term of this patent is extended or adjusted under 35 U.S.C. 154(b) by 765 days.

(21) Appl. No.: 11/897,932

(22) Filed: Aug. 31, 2007

(65) Prior Publication Data

US 2008/0080644 A1   Apr. 3, 2008

Related U.S. Application Data

(60) Provisional application No. 60/848,089, filed on Sep. 29, 2006.

(51) Int. Cl.
*H04B 1/00* (2006.01)

(52) U.S. Cl. .................. 375/350; 375/232; 375/285; 708/303; 708/304; 455/63.1; 455/307

(58) Field of Classification Search .......... 375/229, 375/232, 285, 346, 350; 708/300, 301, 303, 708/304, 322, 323; 455/501, 63.1, 67.11, 455/67.13, 296, 307; 702/66, 75, 86, 191
See application file for complete search history.

(56) References Cited

U.S. PATENT DOCUMENTS

| | | | |
|---|---|---|---|
| 6,765,931 B1 | 7/2004 | Rabenko et al. | |
| 6,856,191 B2 | 2/2005 | Bartuni | |
| 6,999,510 B2 | 2/2006 | Batruni | |
| 7,467,172 B2 * | 12/2008 | Druck | 708/313 |
| 2005/0212589 A1 | 9/2005 | Batruni | |
| 2005/0212596 A1 | 9/2005 | Batruni | |
| 2006/0176989 A1 * | 8/2006 | Jensen | 375/350 |

* cited by examiner

*Primary Examiner*—Dac V Ha
(74) *Attorney, Agent, or Firm*—Van Pelt, Yi & James LLP

(57) ABSTRACT

A digital signal processor (DSP) comprises an input terminal configured to receive an input, an adaptive nonlinear phase filter coupled to the input terminal, the adaptive nonlinear phase filter having a time-varying phase response, and an adaptive nonlinear amplitude filter coupled to the input terminal, the adaptive nonlinear amplitude filter having a time-varying amplitude response.

A method of processing a signal comprises receiving the signal, sending the signal to an adaptive nonlinear phase filter, the adaptive nonlinear phase filter having a time-varying phase response, and sending the signal to an adaptive nonlinear amplitude filter, the adaptive nonlinear amplitude filter having a time-varying amplitude response.

21 Claims, 23 Drawing Sheets

NONLINEAR DIGITAL SIGNAL PROCESSOR

CROSS REFERENCE TO OTHER APPLICATIONS

This application claims priority to U.S. Provisional Patent Application No. 60/848,089 entitled ADAPTIVE SELF-LINEARIZATION: LOW-POWER AND LOW-COMPLEXITY SYSTEM OPERATION AND ARCHITECTURE, filed Sep. 29, 2006 which is incorporated herein by reference for all purposes.

BACKGROUND OF THE INVENTION

Nonlinearity is a problem present in many signal processing systems. For example, the channel and the devices can introduce nonlinearity to a transmitted signal, thus causing distortion in the output. A typical way of correcting the nonlinearity is by using a training signal with known signal characteristics such as amplitude, phase, frequency, data sequence, and modulation scheme. The nonlinearities in the system will introduce distortion. The received signal is a composite signal of a distorted component, and an undistorted component that corresponds to the ideal, undistorted training signal. During a training period, the training signal is available to the receiver. Filters in the receiver's signal processor are adjusted until the output matches the training signal. This training technique requires that the ideal, undistorted training signal be available during the training period. The technique is sometimes impractical since adding the training to the manufacturing process will increase the cost of the device. Further, system nonlinearities may vary due to factors such as variations in signal paths, power supply, temperature, signal dynamics, Nyquist zone of the signal, and/or aging of components. It is, however, often impractical to re-train the device since the undistorted training signal may no longer be available. It would be desirable, therefore, to be able to more easily compensate for system nonlinearity. Some applications have greater tolerance for the amount of time required to carry out the compensation. Thus, it would also be useful to have low complexity and low cost solutions for applications with less stringent timing requirements.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Signal linearization is described. As used herein, linearization refers to removing or compensating the nonlinearities in a signal. In some embodiments, based on an unknown distorted signal that is received, self-linearization is performed to compensate for nonlinear distortion and obtain an output signal that is substantially undistorted. As used herein, self-linearization refers to calibration/linearization that does not require a training signal whose specific characteristics (such as frequency components, amplitudes, phases, data sequence, and/or modulation scheme) are already known to the module receiving the signal. In some embodiments, a digital signal processor comprising an adaptive nonlinear phase filter and an adaptive nonlinear amplitude filter is used.

Figure 1A:
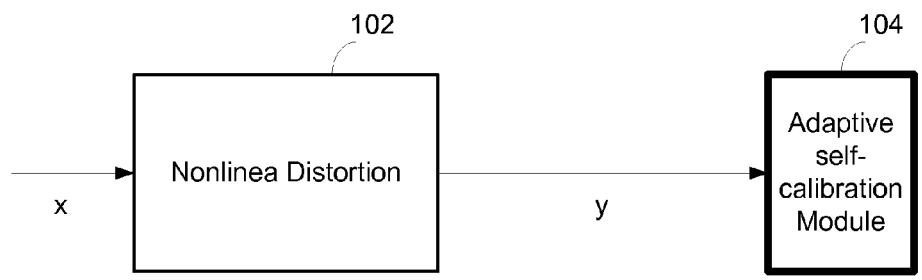
FIG. 1A is a system diagram illustrating an embodiment of a system that includes an adaptive self-linearization module.

FIG. 1A is a system diagram illustrating an embodiment of a system that includes an adaptive self-linearization module. An unknown input signal x is distorted by block 102, generating a distorted signal y. Block 102 represents nonlinear distortion introduced by the transmission media, electronic circuits, or any other source. An adaptive self-linearization module 102 is configured to correct for the distortion based on the received signal y.

Figure 1B:
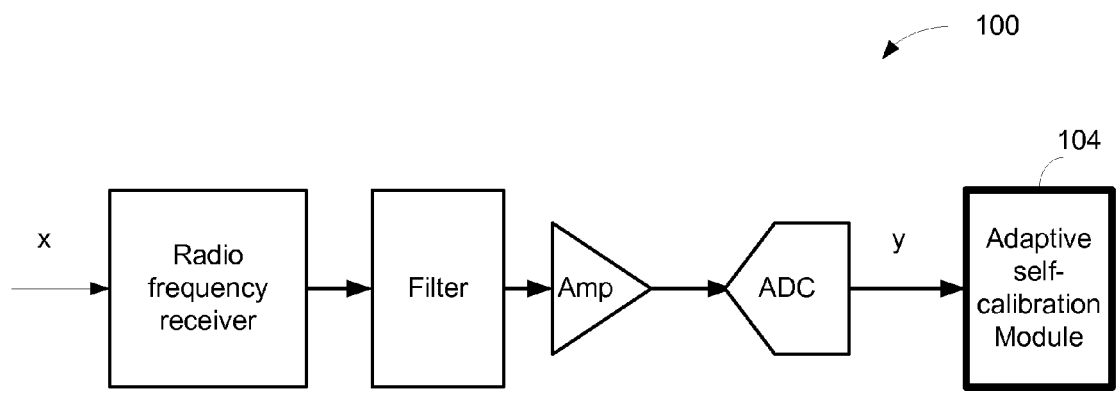
FIG. 1B is a system diagram illustrating an embodiment of a wireless receiver that includes an adaptive self-linearization module.

FIG. 1B is a system diagram illustrating an embodiment of a wireless receiver that includes an adaptive self-linearization module. The system is used to illustrate one application of the adaptive self-linearization module, although many other applications and configurations exist. In the example shown, system 100 is a receiver. The system has a number of components including a radio frequency receiver, a filter, an amplifier, an analog to digital converter. Each of the components has some nonlinear characteristics, causing nonlinear distortion to the input signal. An adaptive self-linearization module 102 is configured to correct for nonlinearities in the receiver electronics, as well as the nonlinearities in the transmission channel. The adaptive self-linearization module can also be used to correct nonlinearities in other systems where an input signal is distorted by nonlinearity introduced by device components and/or transmission media. For example, the adaptive self-linearization module is sometimes included in transmitters, amplifiers, analog to digital converters, and many other types of electronic circuits to correct for system nonlinearities.

Figure 2:
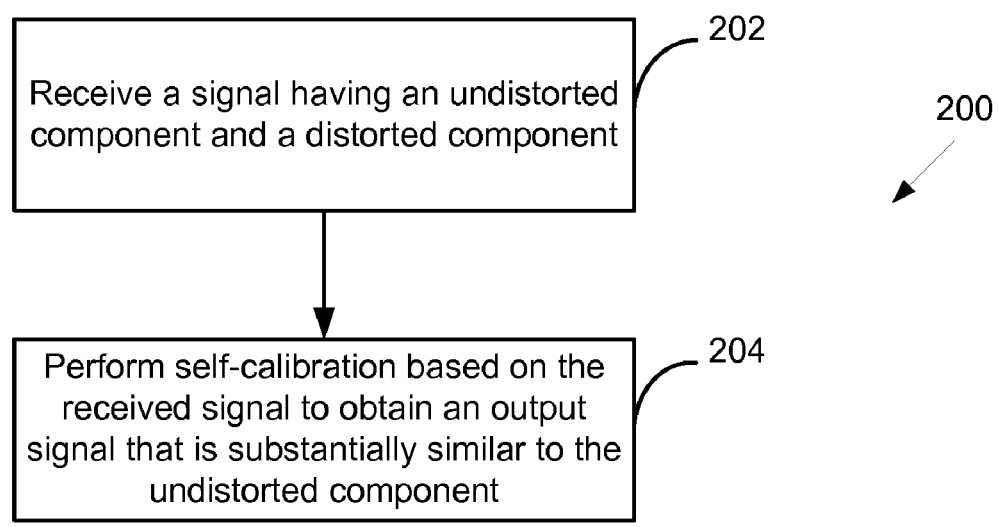
FIG. 2 is a flowchart illustrating an embodiment of a signal processing process.

FIG. 2 is a flowchart illustrating an embodiment of a signal processing process. Process 200 may be implemented on adaptive self-linearization module 102 of system 100. The process initiates when an unknown signal having an undistorted, ideal component and a distorted component is received (202). The signal is said to be unknown with respect to the receiver of the signal since specific characteristics that define the undistorted component of the signal, such as amplitude, phase, signal frequency, data sequence, or modulation scheme are not necessarily available to the receiver. In other words, the receiver does not necessarily have direct access to the undistorted component, nor is the receiver necessarily able to reproduce the undistorted component without further linearization. Self-linearization, sometimes also referred to as blind linearization, is performed based on the received signal to obtain an output signal that is substantially similar to the undistorted component (204). A training signal with known signal characteristics is not required. Thus, the nonlinearities in the system can be corrected while the system is operating in the field. The linearization can be done in real time since it requires no more than a few hundred milliseconds from the time an unknown signal is received. The nonlinear characteristics of the system may change during operation due to nonlinearity causing factors such as variations in the signal source, the paths, the power supply, temperature, signal dynamics, Nyquist zone of the signal, sampling frequency, aging of components, component value tolerances, etc. The adaptive self-linearization module can repeatedly or continuously adapt to correct the nonlinearities despite changes in any of these factors. Further, the operation of the adaptive self-linearization module is independent of the modulation scheme or encoding scheme of the received signal.

Figure 3A:
FIGS. 3A-3C are frequency domain signal spectrum diagrams illustrating an example of nonlinear distortion in a signal.
Figure 3B:
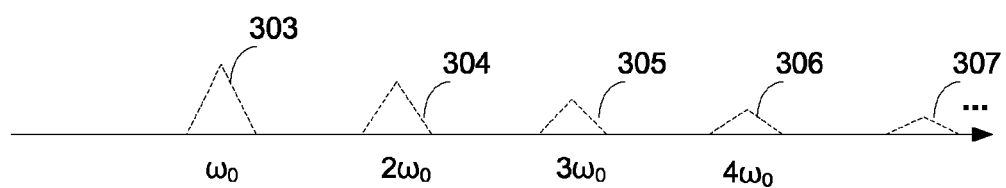
Figure 3C:
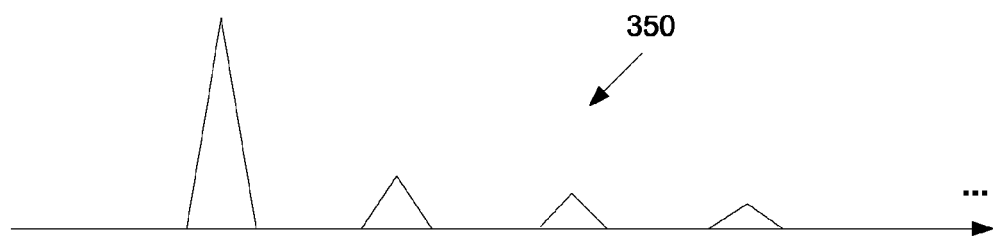

FIGS. 3A-3C are frequency domain signal spectrum diagrams illustrating an example of nonlinear distortion in a signal. In FIG. 3A, signal 300 is an ideal, undistorted signal x centered at $\omega_0$. Nonlinear characteristics of the system lead to distorted components, which are shown in FIG. 3B. The distorted components occur at integer multiples of center frequency $\omega_0$. The resulting signal to be received and processed by the adaptive self-linearization module is shown in FIG. 3C.

It is assumed that the distortion signal can be expressed using a Taylor series. Even harmonics such as 304 and 306 are caused by distortion terms that are even powers of the signal ($x^2$, $x^4$, etc.). The even harmonics are relatively easy to remove since they are outside the fundamental frequency band of the desired signal. Odd harmonics such as 303, 305, and 307 are caused by distortion terms that are odd powers of the signal ($x^3$, $x^5$, etc.). It is more difficult to remove the odd harmonics since harmonic 303 lies within the fundamental frequency band of the desired signal. As will be shown in more detail below, the adaptive self-linearization module is able to approximately produce the distorted components, thereby approximately determine the ideal, undistorted signal 300. Adaptive self-linearization can be performed based on an unknown signal received while the device is operating (as opposed to using a known training signal). Further, an adaptive self-linearization module allows the device to be calibrated regardless of variations in the nonlinearity causing factors.

Figure 4A:
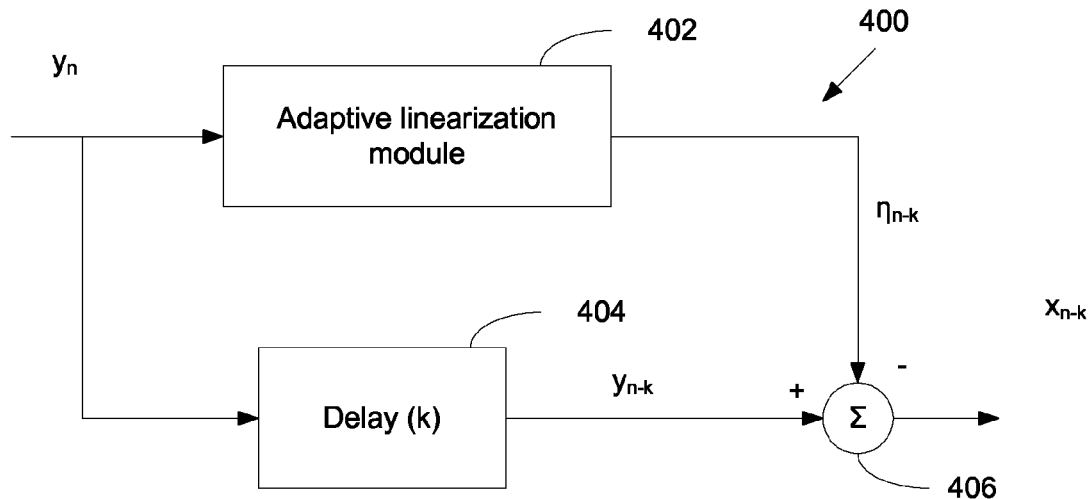
FIG. 4A is a diagram illustrating an embodiment of an adaptive self-linearization module.

FIG. 4A is a diagram illustrating an embodiment of an adaptive self-linearization module. In the example shown, module 400 includes an adaptive linearization module 402 and a delay component 404. Based on its input $y_n$, the adaptive linearization module configures its internal filters to generate an output that approximates the distorted component. Since the adaptation process leads to a delay of k samples in the output, the output is denoted as $\eta_{n-k}$. Details of how the adaptation is made are described below. $y_n$ is sent to a delay module to obtain a delayed version, $y_{n-k}$. Combiner 406 combines $\eta_{n-k}$ from $y_{n-k}$ to obtain the desired, linearized signal component $x_n$. As used herein, combining may be addition or subtraction.

Figure 5A:
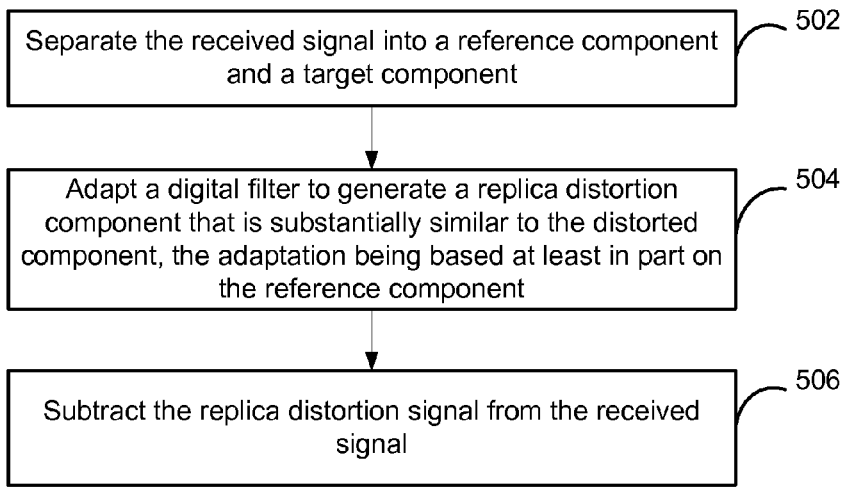
FIG. 5A is a flowchart depicting an embodiment of an adaptive self-linearization process.

FIG. 5A is a flowchart depicting an embodiment of an adaptive self-linearization process. Process 500 shown in the example may be implemented on an adaptive self-linearization module such as 400. During the process, an unknown distorted signal is separated into a reference component and a target component (502). The reference component, sometimes referred to as the offending signal, includes an estimate of one or more signal components that cause the nonlinear distortion in the unknown distorted signal. In some embodiments, the reference component includes an aggregated version of the undistorted component as well as the harmonics within the frequency band of the undistorted component. The harmonics are relatively small and their effects can be ignored for practical purposes. In some embodiments, the reference component includes one or more noise signals in a frequency band separate from that of the desired signal. The target component is the difference between the input signal and the reference component. A digital filter is adapted to generate a replica distortion signal that is substantially similar to the distorted component. The adaptation is based at least in part on the reference component and the target component (504). By separating the reference and target components, the system can train its filter based on a received signal whose characteristics are not known prior to the training. The replica distortion signal is subtracted from the unknown distorted signal to generate the distortion corrected output (506).

Figure 6:
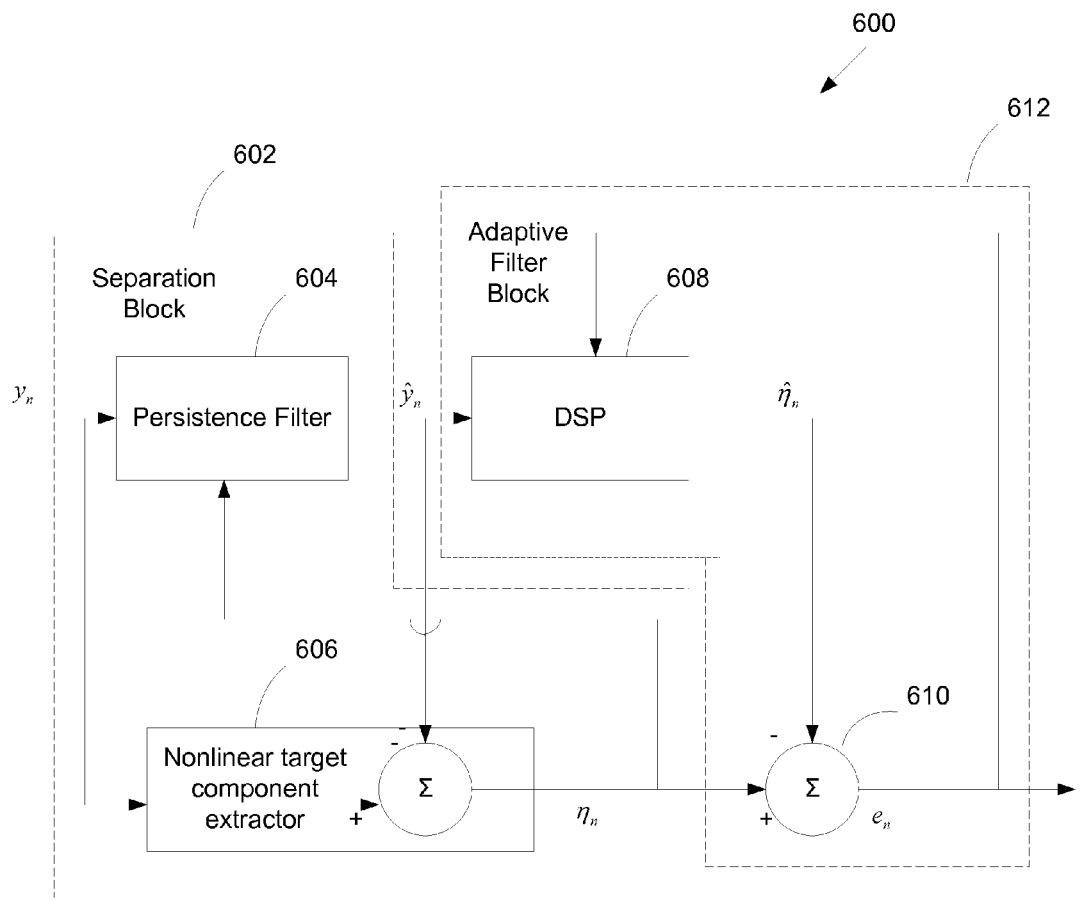
FIG. 6 is a diagram illustrating details of an embodiment of an adaptive linearization module.

FIG. 6 is a diagram illustrating details of an embodiment of an adaptive linearization module. In the example shown, system 600 includes a separation block 602 and an adaptive filter block 612. $y_n$ is a received signal with distortion. The signal is sent to separation block 602, which includes a persistence filter 604 and a nonlinear signal extractor 605. As will be shown in more detail below, the separation block is configured to extract from the input signal $y_n$ a reference component $\hat{y}_n$. In this example, $\hat{y}_n$ is a linearly enhanced version of the input signal. The target component $\eta$ is a function of the received signal and its history. At each time instance, $\eta_n$ is expressed as $y_n - \hat{y}_n$.

For example, let the received signal $y_n = 1.001 x_n + 0.01 x_n^3$, where $x_n$ is the desired undistorted component, and $0.001 x_n + 0.01 x_n^3$ is the distorted component. A properly configured separation filter will produce a reference component $\hat{y}_n$ that is approximately $kx_n$ (k being a value close to 1), and a target component $\eta_n$ that is $y_n - kx_n$.

In some embodiments, the nonlinear signal extractor further includes a delay element to give the input the same amount of delay as the separation filter. In some embodiments, the nonlinear signal extractor optionally includes a band pass filter, a low pass-filter, or a high pass filter. The additional filter is appropriate, for example, in applications where the frequency band of the reference component is known.

Returning to FIG. 6, $\hat{y}_n$ and $\eta_n$ are both sent to an adaptive filter block 612, which includes an adaptive nonlinear digital signal processor (DSP) 608. The adaptive nonlinear DSP is sometimes implemented using an adaptive nonlinear filter. DSP 608 may be implemented using any suitable techniques, such as techniques described in U.S. Pat. No. 6,856,191 by Batruni entitled "NONLINEAR FILTER" and U.S. Pat. No. 6,999,510 by Batruni entitled "NONLINEAR INVERSION", which are herein incorporated by reference for all purposes. The patents incorporated by reference describe techniques for building nonlinear filters using linear elements, and for adapting such nonlinear filters to achieve desired transfer characteristics.

The DSP's inputs include the reference component $\hat{y}_n$ and a feedback error signal $e_n$ that is the difference between the target component $\eta_n$ and the DSP's output $\hat{\eta}_n$. The DSP is configured to use $\hat{y}_n$ as its input and $\eta_n$ as its training signal to adapt its filter coefficients and drive the error signal to a predetermined level. The filter coefficients of the DSP's digital filters may be adapted using adaptive techniques including Least Mean Squares (LMS), Recursive Least Squares (RLS), or any other suitable adaptive techniques. The DSP adapts to implement a filter having a transfer function that is approximately the same as the nonlinear transfer function of the system, so that eventually the DSP's output $\hat{\eta}_n$ is about the same as $\eta_n$. In other words, the DSP's adapted transfer function approximately corresponds to the transfer function representing the relationship of the distorted component with respect to the undistorted component. Assuming that the distorted component at the fundamental frequency is relatively small (e.g., $0.001 x_n$ as in the example discussed above), its effect is negligible and therefore is for all practical purposes ignored. In the above example, DSP 608 will adapt its filter parameters such that a transfer function of approximately $0.01 x_n^3$ is obtained.

In the embodiment shown, the error signal of the DSP is expressed as:

$$e_n = \eta_n - W_n^T \hat{Y}_n \tag{1}$$

where $W_n^T = [w_n\ w_{n-1}\ \ldots\ w_{n-N+1}\ w_{n-N}]$ are the nonlinear coefficients and $\hat{Y}_n^T = [\hat{y}_n\ \hat{y}_{n-1}\ \ldots\ \hat{y}_{n-N+1}\ \hat{y}_{n-N}]$ is the nonlinear filter's input vector.

The nonlinear coefficients are expressed using the following general form:

$$w_n = a_n \hat{y}_n + b_n + \sum_{j=1}^{K} c_{j,n} |A_{j,n}^T \hat{Y}_n + \beta_{j,n}| \tag{2}$$

$$= a_n \hat{y}_n + b_n + \sum_{j=1}^{K} c_{j,n} (A_{j,n}^T \hat{Y}_n + \beta_{j,n}) \lambda_{j,n}$$

where $$\lambda_{j,n} = \text{sign}(A_{j,n}^T \hat{Y}_n + \beta_{j,n}) \tag{3}$$

$$\hat{Y}_n [\hat{y}_{n+M} \hat{y}_{n+M-1} \ldots \hat{y}_n \ldots \hat{y}_{n-M+1} \hat{y}_{n-M}] \tag{4}$$

$$A_{j,n}^T = [\alpha_{M,n} \alpha_{M-1,n} \ldots \alpha_{0,n} \ldots \alpha_{-M+1,n} \alpha_{-M,n}] \tag{5}$$

The coefficients have a time index n because the filter is adaptive and therefore time-varying. The nonlinear coefficients are adapted as follows:

$$A_{j,n+1}^T = A_{j,n}^T + \mu c_{j,n} \lambda_{j,n} \hat{Y}_n e_n \hat{y}_n \tag{6}$$

$$\beta_{j,n+1} = \beta_{j,n} + \mu c_{j,n} + \lambda_{j,n} e_n \hat{y}_n \tag{7}$$

$$c_{j,n+1} = c_{j,n} + \mu |A_{j,n}^T \hat{Y}_n + \beta_{j,n}| e_n \hat{y}_n \tag{8}$$

$$\alpha_{j,n+1} = \alpha_{j,n} + \mu \hat{y}_n e_n \hat{y}_n \tag{9}$$

$$b_{j,n+1} = b_{j,n} + \mu e_n \hat{y}_n \tag{10}$$

Returning to FIG. 6, separation block 602 employs persistence filter 604 for separating the reference component from the received signal. The persistence filter is designed to boost the linear signal components and attenuate the noise and nonlinear signal components in the received signal. An analogy to the persistence filter is a camera shutter, which allows light to pass for a period of time in order to capture the stationary image. The background images that are non-stationary over this period of time become blurry. Like a camera shutter, over a period of time, the persistence filter captures the persistent portion of an input signal and removes the non-persistent portion. The persistence filter operates on pseudo stationary input signals that are not rapidly changing (for example, a signal that is stationary for at least a few milliseconds). For a pseudo stationary input signal, the persistent portion is the average of the desired reference component, which is relatively stable and enhances over time. In some embodiments, the persistence filter is designed as an averaging, linear filter that emphasizes the undistorted signal over noise, and emphasizes linear signal components over nonlinear distortion.

Figure 7:
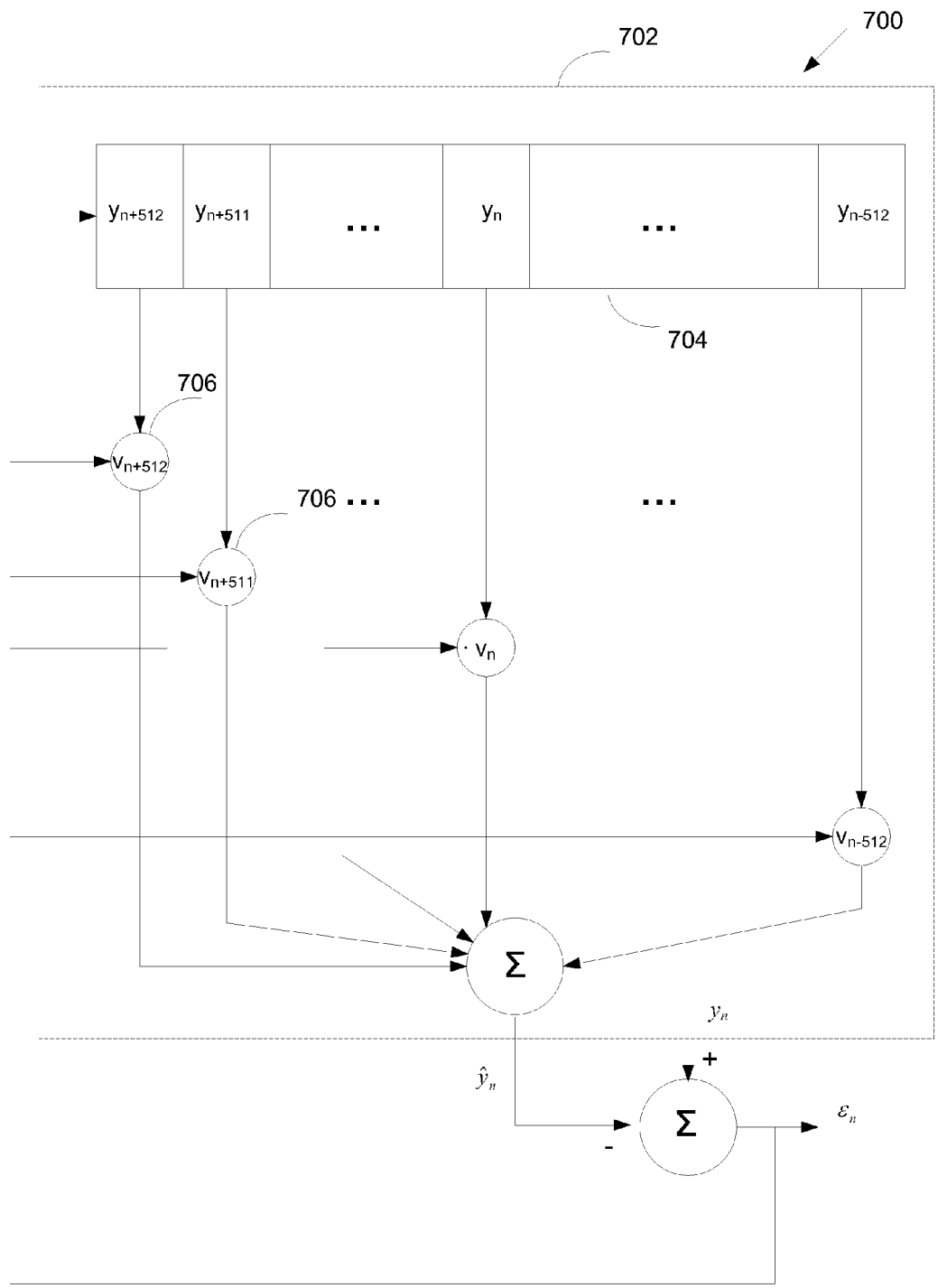
FIG. 7 is a diagram illustrating an embodiment of a separation block.

FIG. 7 is a diagram illustrating an embodiment of a separation block. In this example, separation block 700 includes a persistence filter 702, which includes a delay line 704 to which the input $y_n$ is sent, and a plurality of coefficient multipliers 706. The number of taps in the delay line is represented as $N=2K+1$. In the example shown, $K=512$, which means that the delay line has 1025 taps for delays of 0, 1, 2, ... 1024. Each $y_i$ ($i=n+512, n+511, \ldots, n, \ldots n-511, n-512$) is scaled by multiplying with an adaptable coefficient $v_i$. The multiplication results are summed, producing the linear reference component $\hat{y}_n$. The center tap value $y_n$ is selected, and $\hat{y}_n$ is subtracted from $y_n$ to produce an error $\epsilon_n$. In this case, $\epsilon_n$ corresponds to target $\eta_n$. The error is fed back to update coefficients $v_i$. An adaptive algorithm such as LMS or RLS is used to update the coefficients until $\epsilon_n$ approaches some predefined threshold value. The separation block is configured to receive the input $y_n$, and aggregate $y_n$ over a period of time to produce an aggregate signal that is substantially similar to the undistorted component. The aggregate signal is considered substantially similar when $\epsilon_n$ meets some predefined threshold value. The aggregate signal is then subtracted from the received input.

Figure 8:
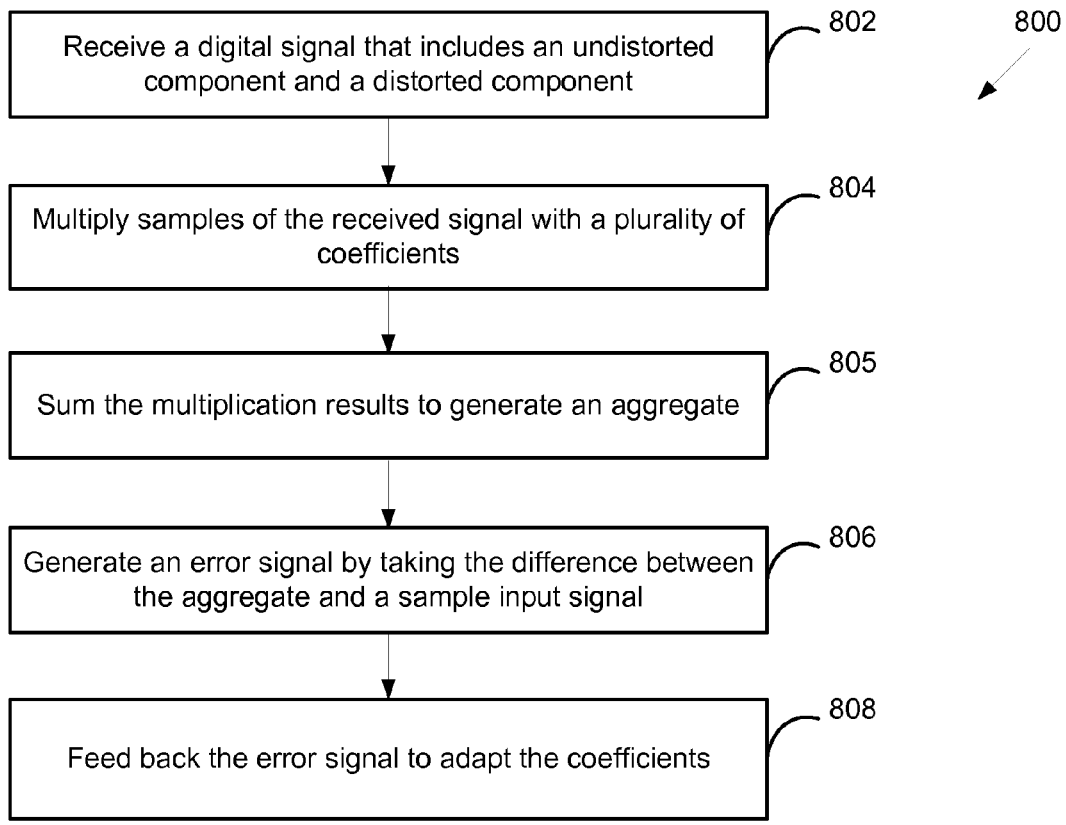
FIG. 8 is a flowchart illustrating an embodiment of a process for extracting an undistorted component from a distorted signal.

FIG. 8 is a flowchart illustrating an embodiment of a process for extracting an undistorted component from a distorted signal. Process 800 may be implemented on a separation block, such as 700 shown in FIG. 7. In this example, during the process, a digital signal that includes an undistorted component and a distorted component is received (802). A plurality of samples of the received signal are multiplied with a plurality of coefficients (804). The multiplication results are summed to produce an aggregate (805). The aggregate enhances the undistorted component and attenuates the distorted component. An error is generated by taking the difference between the aggregate and a sample of the received signal (806). The error is fed back to adapt the coefficients (808).

The persistence filter can be described using the following functions:

$$\eta_n = y_n - V_n Y_n \quad (11)$$

$$\eta_n = y_n - \hat{y}_n \quad (12)$$

$$V_{n+1} = vV_n + \mu\eta_n Y \quad (13)$$

where $Y_n = [y_{n+K}\ y_{n+K-1}\ \cdots\ y_n\ \cdots\ y_{n-K-1}\ y_{n-K}]$, $\mu$ is the adaptation step size that controls the persistency factor of the filter and $v$ is the forgetting factor that controls the speed with which the filter adapts to changing signal dynamics.

Figure 9:
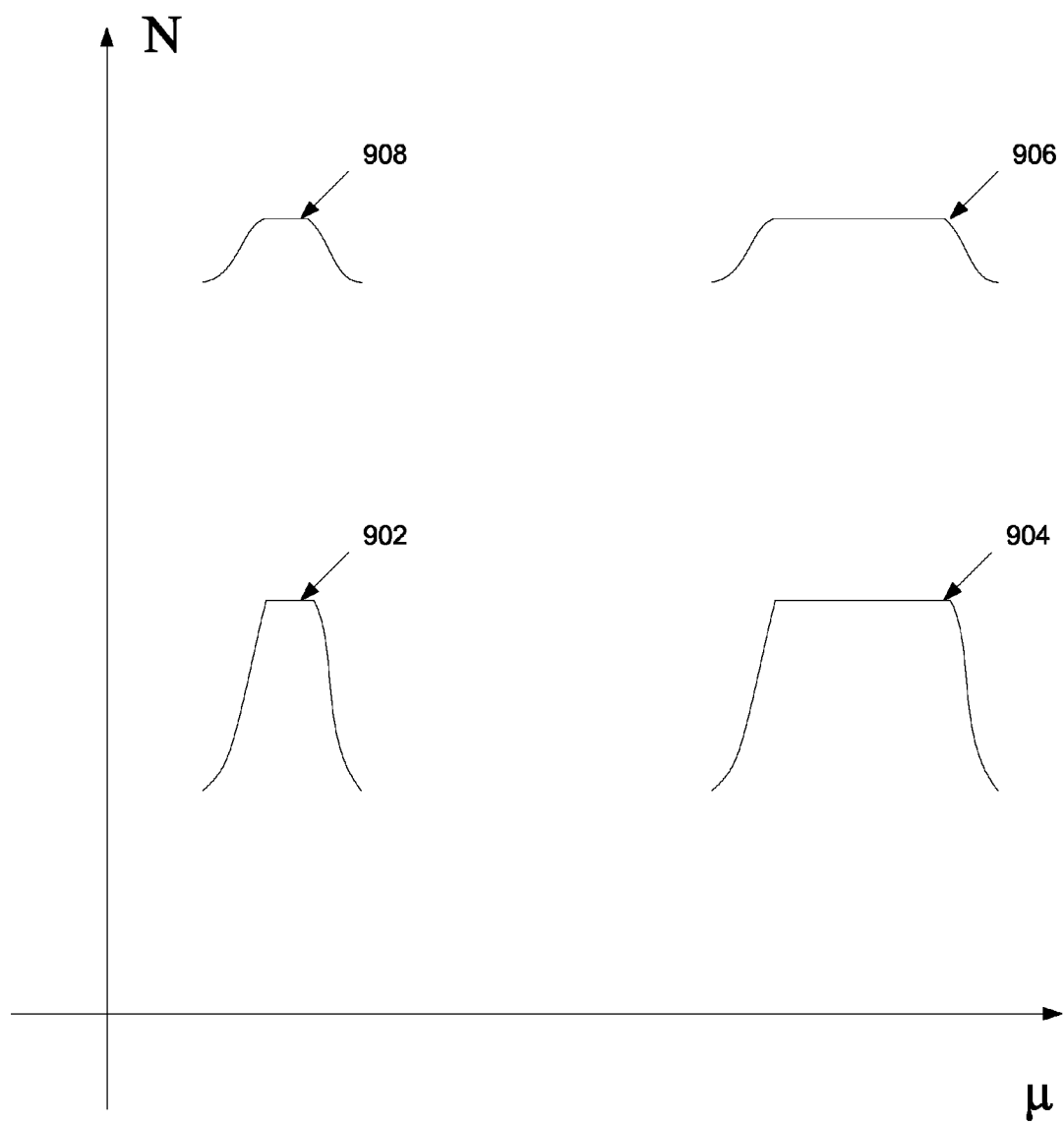
FIG. 9 is a diagram illustrating the relative relationship of step size $\mu$, number of taps N, and the type of linear component that can be effectively extracted.

The number of filter taps N (also referred to as the order of the filter) and the adaptive step size $\mu$ control the persistence filter's operations. A given filter order and step size combination may be particularly effective for emphasizing the received signal's linear component within a certain range of bandwidth and amplitude. FIG. 9 is a diagram illustrating the relative relationship of step size $\mu$, number of taps N, and the type of linear component that can be effectively extracted. The diagram informs the choice of $\mu$ and N. Generally, a higher N (i.e., a greater number of filter taps) should be used as the amplitude of the linear component goes down, and a smaller $\mu$ (i.e., a smaller step size) should be used as the bandwidth of the linear component goes down. As shown in the diagram, if the linear component has a relatively large amplitude and a relatively narrow bandwidth (such as signal 902), a persistence filter with a small $\mu$ and a small N produces good results. A linear component having a similarly large amplitude but a wider bandwidth (signal 904) requires a relatively small N and allows a greater $\mu$. A small amplitude and large bandwidth linear component (signal 906) requires a large N and a large $\mu$. A small amplitude and narrow bandwidth linear component (signal 908) requires a small $\mu$ and a large N. During operation, N and $\mu$ can be adjusted to more effectively generate the emphasized linear component. For example, in some embodiments, a peak detector and a power level detector are used to detect the strength of the signal. The signal strength is a function of the signal's peak and bandwidth. Based on the detected signal strength, appropriate adjustments to N and $\mu$ are made according to system requirements to control the adaptation.

Figure 4B:
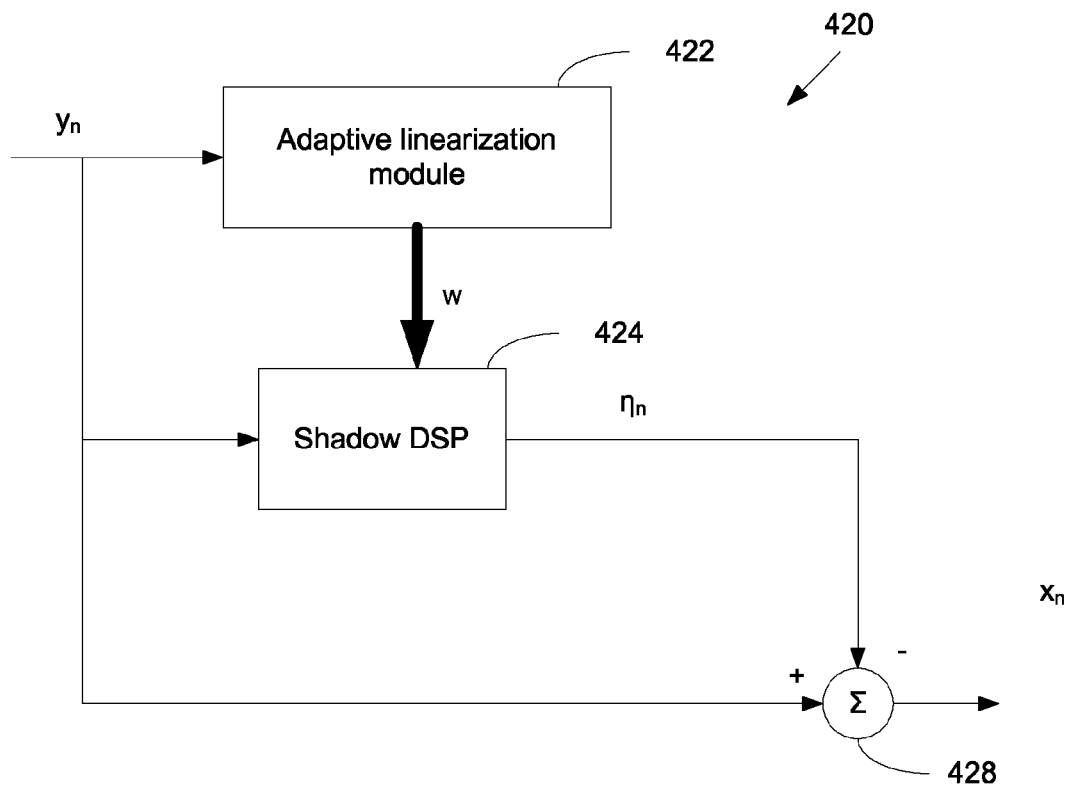
FIG. 4B is a diagram illustrating an embodiment of a low latency adaptive self-linearization system.

In some embodiments, the linearization process requires a large number of samples. The delay k sometimes corresponds to hundreds or even thousands of samples, resulting in delay on the order of tens or even hundreds of milliseconds. Some applications (e.g. telecommunication applications) may require the linearization process to have a lower latency. FIG. 4B is a diagram illustrating an embodiment of a low latency adaptive self-linearization system. In the example shown, system 420 is configured to have much lower latency than system 400. The DSPs shown in the system may be implemented as general or special purpose processors, or configurable filters. Adaptive linearization module 422 configures an internal DSP to simulate the nonlinear transfer function to be corrected and produces an output that is approximately equal to the nonlinear residual signal. As discussed above, assuming that the distortion within the fundamental frequency band is relatively small, a successfully adapted and configured DSP will have a transfer function that is approximately equal to the nonlinear transfer function to be corrected. The linearization module outputs the configuration parameters, w, to a shadow nonlinear DSP 424, which uses the parameters to configure its filters and duplicate the transfer function of the DSP employed by the adaptive linearization module. DSP 424's latency L is on the order of a few milliseconds, which is significantly smaller than the delay due to adaptation k. As such, system 420 has significantly less delay than system 400.

Figure 5B:
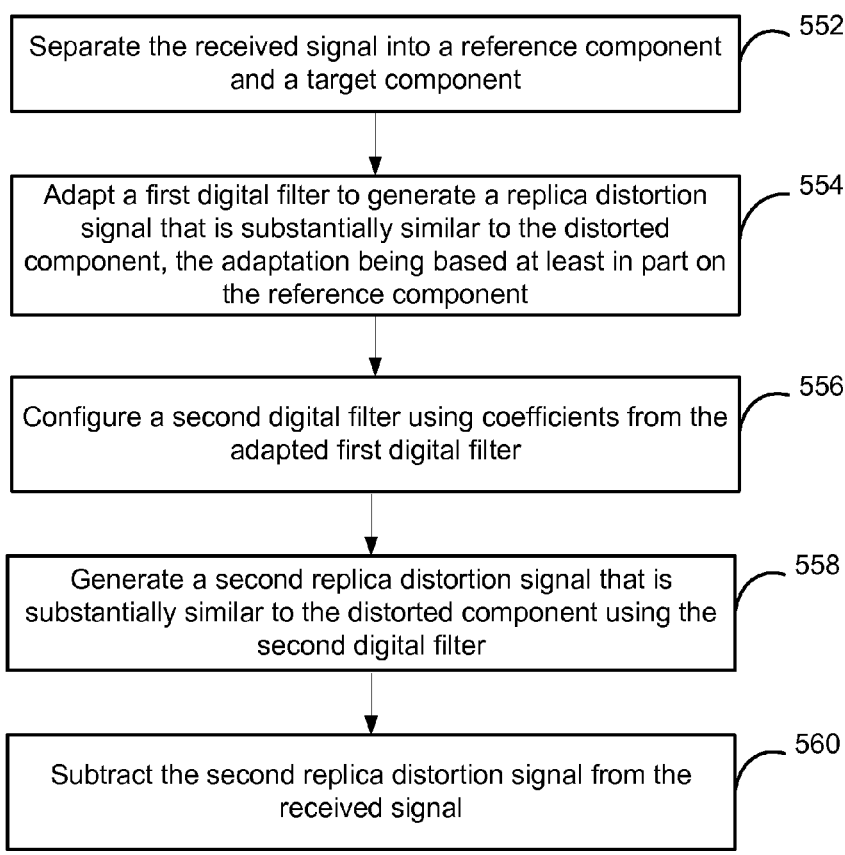
FIG. 5B is a flowchart illustrating another embodiment of an adaptive self-linearization process.

FIG. 5B is a flowchart illustrating another embodiment of an adaptive self-linearization process. Process 550 shown in the example may be implemented on a low latency adaptive self-linearization module such as 420. During the process, an unknown distorted signal is separated into a reference signal and a target signal (552). A first digital filter is adapted to generate a replica distortion signal that is substantially similar to the distorted component, where the adaptation is based at least in part on the reference signal (554). A second digital filter is configured using coefficients from the adapted first digital filter (556). A second replica distortion signal that is substantially similar to the distorted component using the second digital filter (558).

Figure 10A:
FIGS. 10A-10C are frequency domain signal diagrams illustrating an example of a signal whose reference and target components occupy different frequency bands.
Figure 10B:
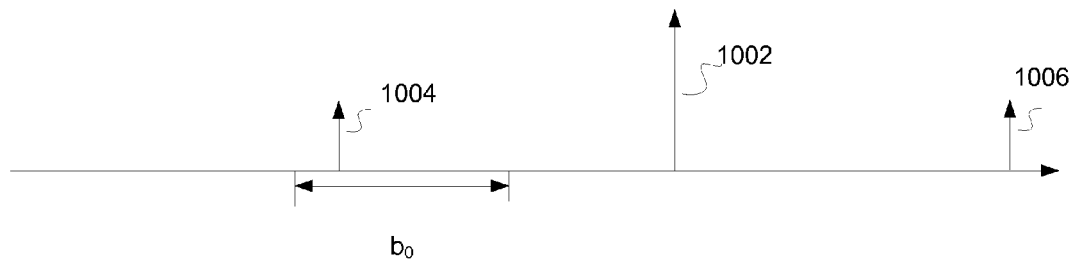
Figure 10C:
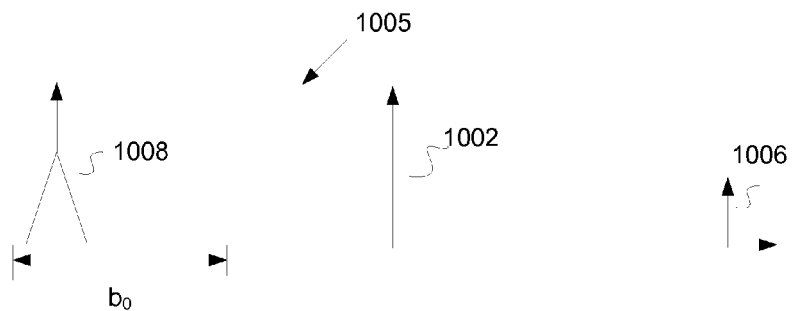

In some embodiments, the reference component and the target component occupy separate frequency bands. FIGS. 10A-10C are frequency domain signal diagrams illustrating an example of a signal whose reference and target components occupy different frequency bands. FIG. 10A shows the ideal, undistorted component 1000, which is limited to frequency band $b_0$. An example of the ideal signal is a radio frequency (RF) signal used in a wireless communication system that employs some form of frequency division, where the signal occupies a specific frequency channel $b_0$. FIG. 10B shows the distortion component, which includes noise signal component 1002 that is outside $b_0$, as well as harmonics of the noise component, including 1004 which falls within frequency channel $b_0$, and 1006 which lies outside $b_0$. An example of noise signal 1002 is another RF signal occupying an adjacent frequency channel relative to signal 1000 and causing distortion in frequency channel $b_0$. FIG. 10C shows the resulting signal 1006. Although the general frequency ranges of the reference and target components are known, the specific characteristics of the signal components are still unknown. Thus, the signal is suitable for processing by any adaptive self-linearization module that implements processes 200 or 500.

Figure 11:
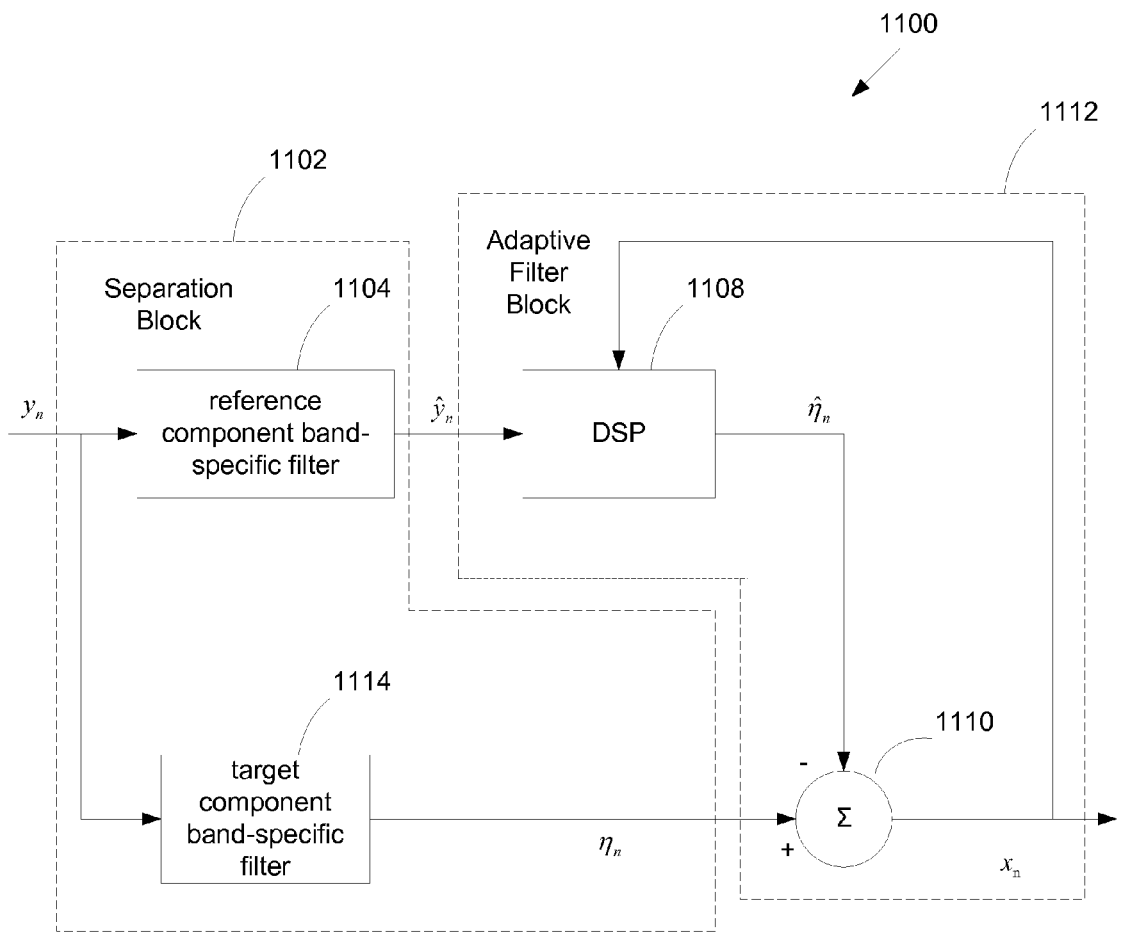
FIG. 11 is a block diagram illustrating another embodiment of an adaptive self-linearization module.

An adaptive self-linearization module such as 400 or 420 described above can be used to process the type of signal shown in FIG. 10C. Assuming that the desired signal causes little distortion in its own frequency band and that most of the distortion in the received signal is caused by noise from neighboring frequency channel(s), it is possible to employ adaptive self-linearization modules with less complex circuitry by taking advantage of the fact that the reference and target components reside in different frequency bands. FIG. 11 is a block diagram illustrating another embodiment of an adaptive self-linearization module. In the example shown, separation block 1102 includes a reference signal band-specific filter 1104 and a target signal band-specific filter 1114. In some embodiments, the reference band-specific filter includes a band-stop filter configured to extract from the received signal the noise component and its harmonics outside frequency band $b_0$ and suppress the components within $b_0$, generating the reference component $\hat{y}_n$. The target signal band-specific filter includes a band-pass filter configured to pass components in frequency band $b_0$ and attenuate the rest of the frequencies, generating the target component $\eta_n$.

Based on reference component $\hat{y}_n$, DSP adapts its parameters to generate a replica of the distorted signal, $\hat{\eta}_n$. The adaptation is possible because the reference component and the distorted signal are correlated. $\hat{\eta}_n$ is subtracted from the target component $\eta_n$ to obtain the desired signal $x_n$. A suitable adaptation technique such as LMS or RLS is used to adapt the DSP. Some embodiments base the adaptation on equations (1)-(10).

Referring to FIGS. 10A-10C as an example, the input signal $y_n$ corresponds to signal 1006. The separation block extracts reference component $\hat{y}_n$ which corresponds to components 1002 plus 1006 and target component $\eta_n$ which corresponds to component 1008. In some embodiments, the separation block further limits the bandwidth of reference component extraction such that only 1002 is extracted. Based on $\hat{y}_n$ and its feedback signal $x_n$, the adaptive DSP adapts its transfer function to generate $\hat{\eta}_n$, which approximately corresponds to signal 1004

Figure 12A:
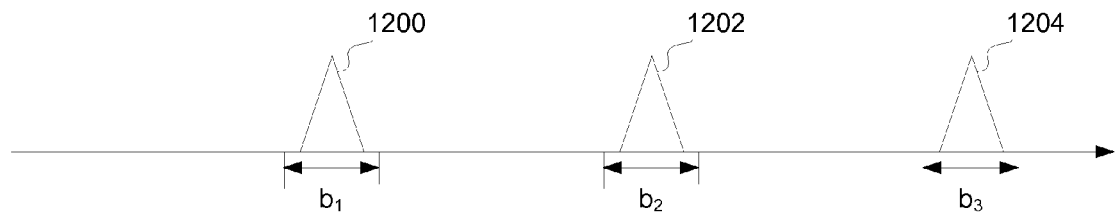
FIGS. 12A-12C are frequency domain signal diagrams illustrating an example where both the reference component and the target component occupy multiple frequency bands.
Figure 12B:
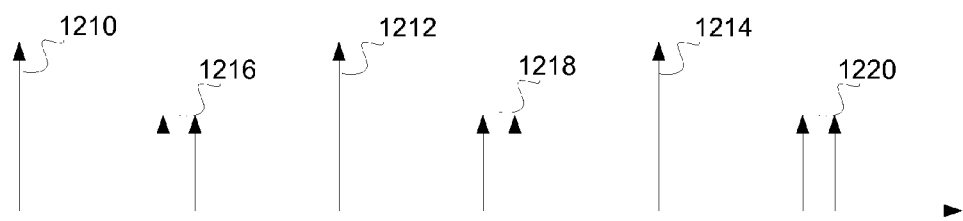
Figure 12C:
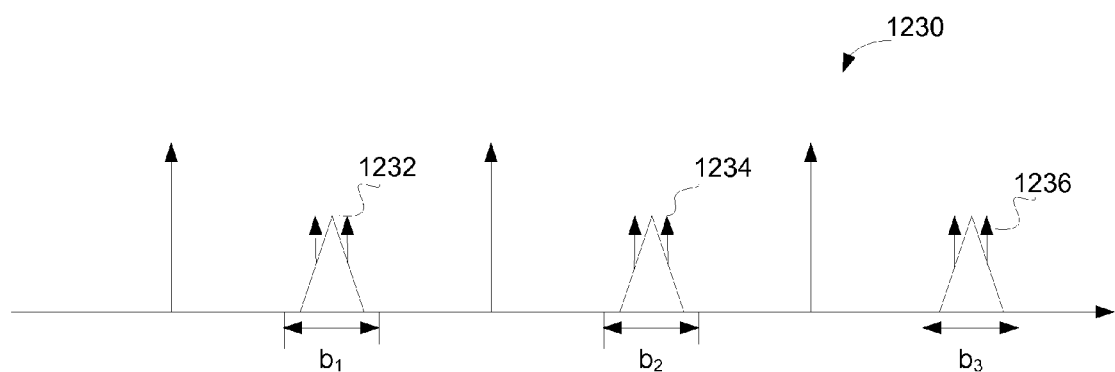

In some embodiments, the offending signals causing distortion in the fundamental frequency band of the desired signal may reside in multiple frequency bands. FIGS. 12A-12C are frequency domain signal diagrams illustrating an example where both the reference component and the target component occupy multiple frequency bands. FIG. 12A shows the undistorted signal components 1200-1204, which occupy separate frequency bands $b_1$-$b_3$. FIG. 12B shows the distorted signal components, which includes several noise components 1210-1214 which reside outside $b_1$-$b_3$, and their harmonics 1216, 1218, and 1220 which reside within $b_1$, $b_2$, and $b_3$ respectively. FIG. 12C shows the resulting distorted signal 1230.

Figure 13:
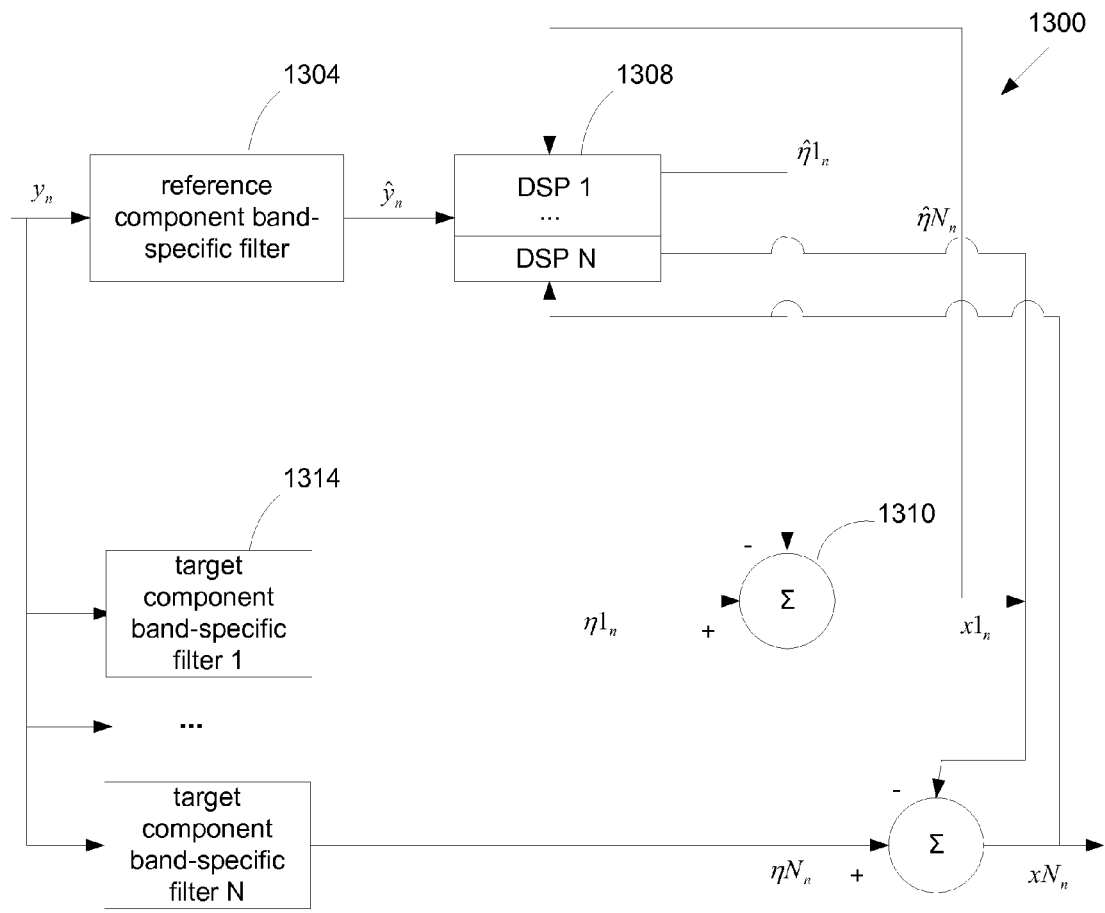
FIG. 13 is a block diagram illustrating an embodiment of an adaptive self-linearization system configured to correct a distorted signal (such as 1230 of FIG. 12C) whose reference components and target components occupy multiple separate frequency bands.

FIG. 13 is a block diagram illustrating an embodiment of an adaptive self-linearization system configured to correct a distorted signal (such as 1230 of FIG. 12C) whose reference components and target components occupy multiple separate frequency bands. In the example shown, system 1300 includes a reference component band-specific filter 1304 for selecting reference signal components $\hat{y}_n$ that cause distortion (e.g., signal components 1210-1214 shown in FIG. 12B). Filter 1304 may be implemented using a plurality of bandpass filters. The system also includes N target component band-specific filters for producing target components $\eta k_n$ (k= 1, . . . , N) in specific frequency bands. In the example shown in FIG. 12C, N=3, and target components corresponding to 1232, 1234 and 1236 are produced. N DSPs are each adapted based on the reference component and a corresponding feedback signal $xk_n$ to generate distortion components $\hat{\eta}k_n$ (k= 1, . . . , N). Each $\hat{\eta}k_n$ is subtracted from the target component $\eta_n$ to obtain the desired signal $x_n$. The adaptation technique of each DSP is similar to what was described in FIG. 11.

Figure 14:
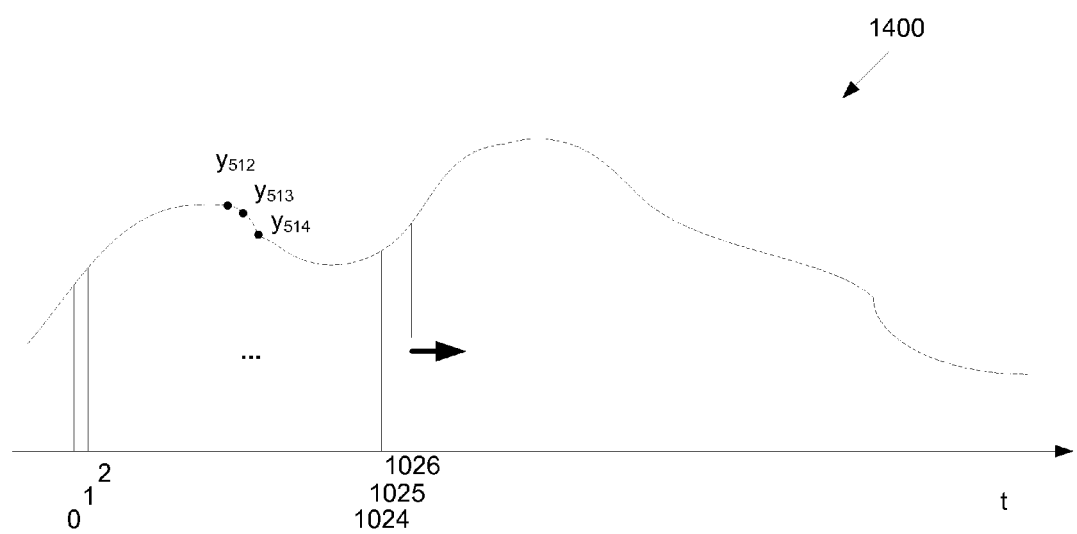
FIG. 14 is a signal diagram illustrating the operations of an example separation block such as block 700 of FIG. 7.

Returning to the example shown in FIG. 6, where an adaptive linearization module 600 is in some embodiments implemented using separation block 700 of FIG. 7. FIG. 14 is a signal diagram illustrating the operations of an example separation block such as block 700 of FIG. 7. In the diagram shown, a nonlinear signal 1400 is received and processed by the separation block. The length of the separation block's delay line is 1025. At time t=0, the first computation cycle begins. Samples $y_0$-$y_{1024}$ are multiplied with corresponding adaptable coefficients $v_0$-$v_{1024}$, and the multiplication results are summed to produce linear reference sample $\hat{y}_{512}$, which is subtracted from the center tap value $y_{512}$ to produce an error $\eta_{512}$ for updating the adaptable coefficients. At time t=1, the next computation cycle begins. Samples $y_1$-$y_{1025}$ are multiplied with the updated coefficients $v_0$-$v_{1024}$ to produce linear reference sample $\hat{y}_{513}$, which is subtracted from the center tap value $y_{513}$ to produce an error $\eta_{513}$ that is used to update the adaptable coefficients. The separation block repeats the computation on every input clock cycle to generate a reference component sample and an error value, and continuously updates the adaptable coefficients.

The reference signal $\hat{y}_n$ is sent to the adaptive filter block to train the DSP to generate a replica of the nonlinear component of the input. The DSP converges quickly because the separation block generates a reference signal sample during each input clock cycle. Since the DSP will continuously adapt to model system nonlinearities, the great amount of computation involved (especially the number of multiplications) demands high power consumption. Further, the implementation of the separation block is more complex and efficient because of the number of parallel multiplications. There are situations where the requirement of convergence speed is relaxed. For example, many electronic devices that could benefit from adaptive self-linearization only require the adaptation to be carried out during startup, and a few seconds of delay is tolerated. It would be useful if the separation block design could be simplified.

Figure 15A:
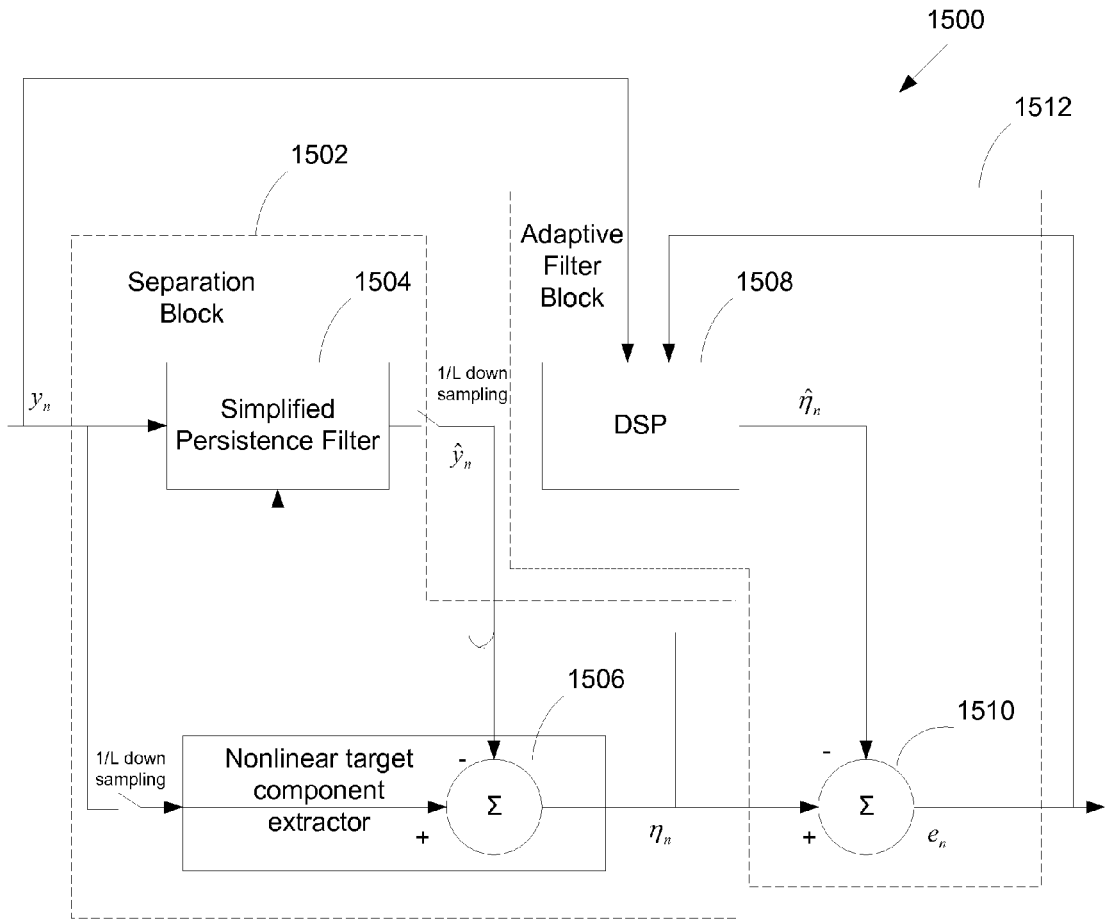
FIG. 15A is a block diagram illustrating an embodiment of a simplified adaptive self-linearization module.

FIG. 15A is a block diagram illustrating an embodiment of a simplified adaptive self-linearization module. In the example shown, the principle of operation of module 1500 is similar to that of adaptive linearization module 400 of FIG. 4A, where an unknown input signal $y_n$ is received, and self-linearization is performed based at least in part on the unknown signal to obtain an output signal that is substantially undistorted. Separation block 1502, which includes a simplified persistence filter 1504 and a nonlinear target component extractor 1506, separates the input signal into a linear reference component $\hat{y}_n$ and a nonlinear target component $\eta_n$. $\eta_n$ is fed back to the persistence filter to adapt the filter coefficients. Adaptive filter block 1512 updates a DSP 1508 based on the input signal and a feedback error signal $e_n$ that is generated based on the DSP output and the target component, to generate a replica of the nonlinear component of the input, $\hat{\eta}_n$.

The simplified adaptive linearization module operates at a lower rate to save power. During adaptation, simplified persistence filter 1504 receives the input signal $y_n$ at full rate but computes one output every L samples, where L is an integer greater than 1. Thus, the adaptive linearization module operates at a rate of R/L. The output of the simplified persistence filter, reference signal $\hat{y}_n$, is also generated at a down sampled rate of R/L. For purposes of simplicity, in the following discussion the input sampling rate R is assumed to be 1 and the down sampled rate is therefore 1/L. The input to nonlinear target component extractor 1506 is also down sampled at a rate of 1/L. In other words, one of every L input samples is sent to the extractor, which subtracts from its input the output of the simplified persistence filter to generate the nonlinear target signal $\eta_n$. DSP 1508 processes $y_n$, and updates its filter coefficients at a rate of 1/L to generate the nonlinear replica signal $\hat{\eta}_n$. $\hat{\eta}_n$ is compared with $\eta_n$ using comparator 1510 to generate an error signal $e_n$, which is fed back to DSP to adapt its internal filter coefficients. Since both the persistence filter and DSP operate at a slower rate, power consumption is reduced and chip circuitries are less complex.

Figure 15B:
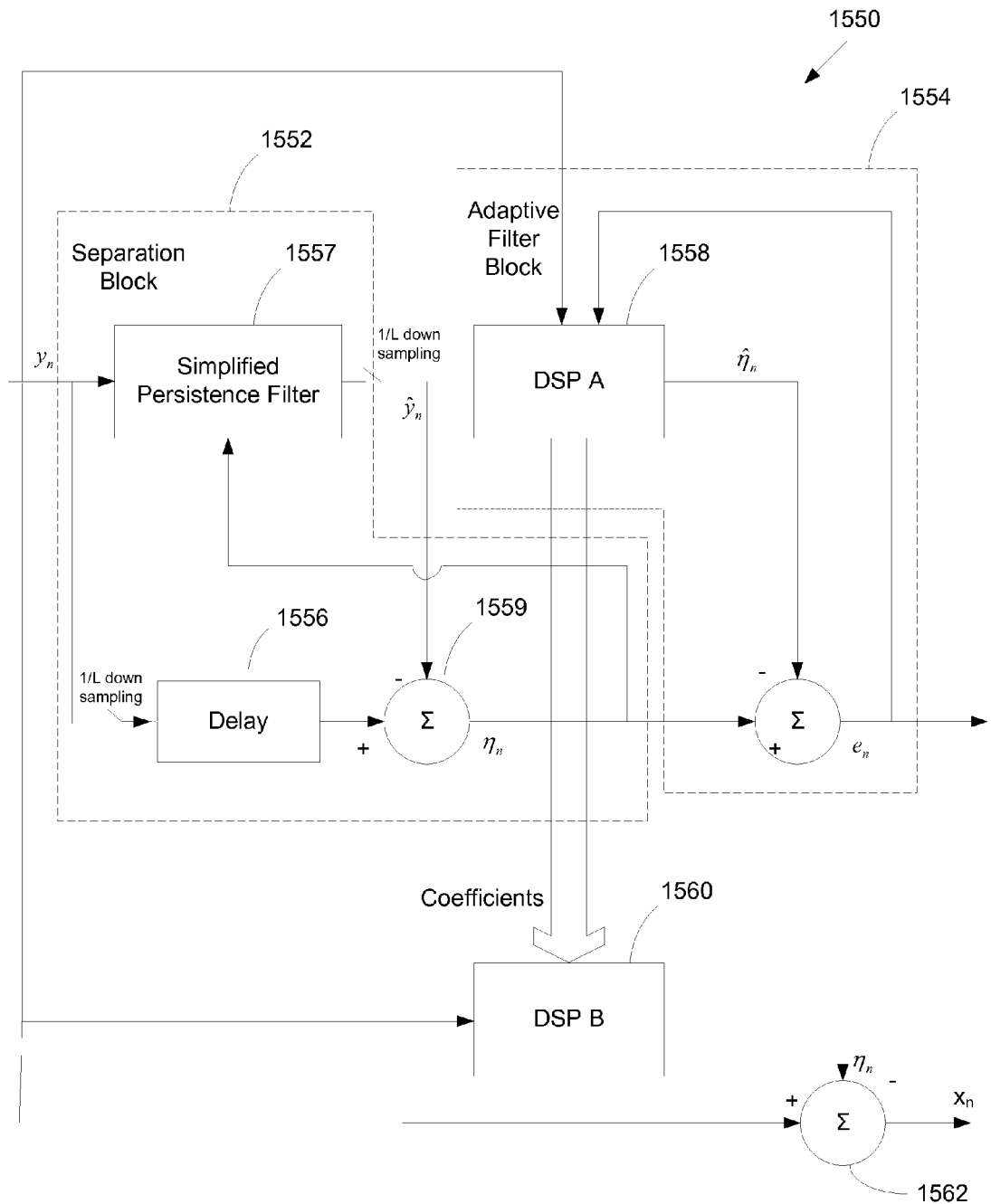
FIG. 15B is a block diagram illustrating another embodiment of a simplified adaptive linearization system.

FIG. 15B is a block diagram illustrating another embodiment of a simplified adaptive linearization system. In this example, the principle of operation of system 1550 is similar to that of adaptive linearization system 420 of FIG. 4B. Module 1550 has a similar separation block 1552 and adaptive filter block 1554 as module 1500. Separation block 1552 includes a delay element 1556 that delays down-sampled input by L, and a nonlinear target component extractor 1559 configured to subtract the reference signal $\hat{y}_n$ from the delayed, down-sampled input to produce a target signal $\eta_n$. As discussed above, assuming that the distortion within the fundamental frequency band is relatively small, a successfully adapted and configured DSP will have a transfer function that is approximately equal to the nonlinear transfer function to be corrected. Once DSP A 1558 converges, the coefficients of the DSP engine are copied to shadow DSP B 1560. The input to DSP B is the distorted input $y_n$ without any delay, and the output of DSP B is a replica distortion signal that is substantially similar to the distorted component of the input signal. Thus, the replica distortion signal generated by DSP B is based at least in part on the target component adaptively generated by DSP A. The replica distortion signal is cancelled directly from the input signal without delay. The resulting output signal of the system, $x_n$, is a linearized signal with little delay and low latency. Because components 1557, 1556, 1558 all operate at down-sampled rate 1/L, resources such as operators can be shared and power consumption is reduced.

The simplified separation block is described using the following equations:

$$\eta_n = y_n - V_n Y_n \quad (14)$$

$$\eta_n = y_n - \hat{y}_n \quad (15)$$

$$V_{n+1} = v V_n + \mu \eta_n Y_n \quad (16)$$

where input vector $Y_n = [y_{n+K} y_{n+K-1} \cdots y_n \cdots y_{n-K-1} y_{n-K}]$ and filter coefficient vector $V_n = [v_{n+K} v_{n+K-1} \cdots v_n \cdots v_{n-K-1} v_{n-K}]$. In some embodiments, the initial value of $V_n$ is chosen such that only the center tap is 1 and the rest of the coefficients are 0 (i.e., $V_n = [0\ 0\ \ldots\ 1\ \ldots\ 0\ 0]$). Other starting values are possible. $\mu$ is the adaptation step size that controls the persistency factor of the filter and $v$ is the forgetting factor that controls the speed with which the filter adapts to changing signal dynamics. The values of $\mu$ and $v$ are chosen depending on factors such as signal bandwidth, required speed of convergence, etc.

The next set of values is obtained L samples later. The simplified separation block can be described using the following equations:

$$\eta_{n+L} = y_{n+L} - V_{n+L} Y_{n+L} \quad (17)$$

$$\eta_{n+L} = y_{n+L} - \hat{y}_{n+L} \quad (18)$$

$$V_{n+L+1} = v V_{n+L} + \mu \eta_{n+L} Y_{n+L} \quad (19)$$

Figure 16:
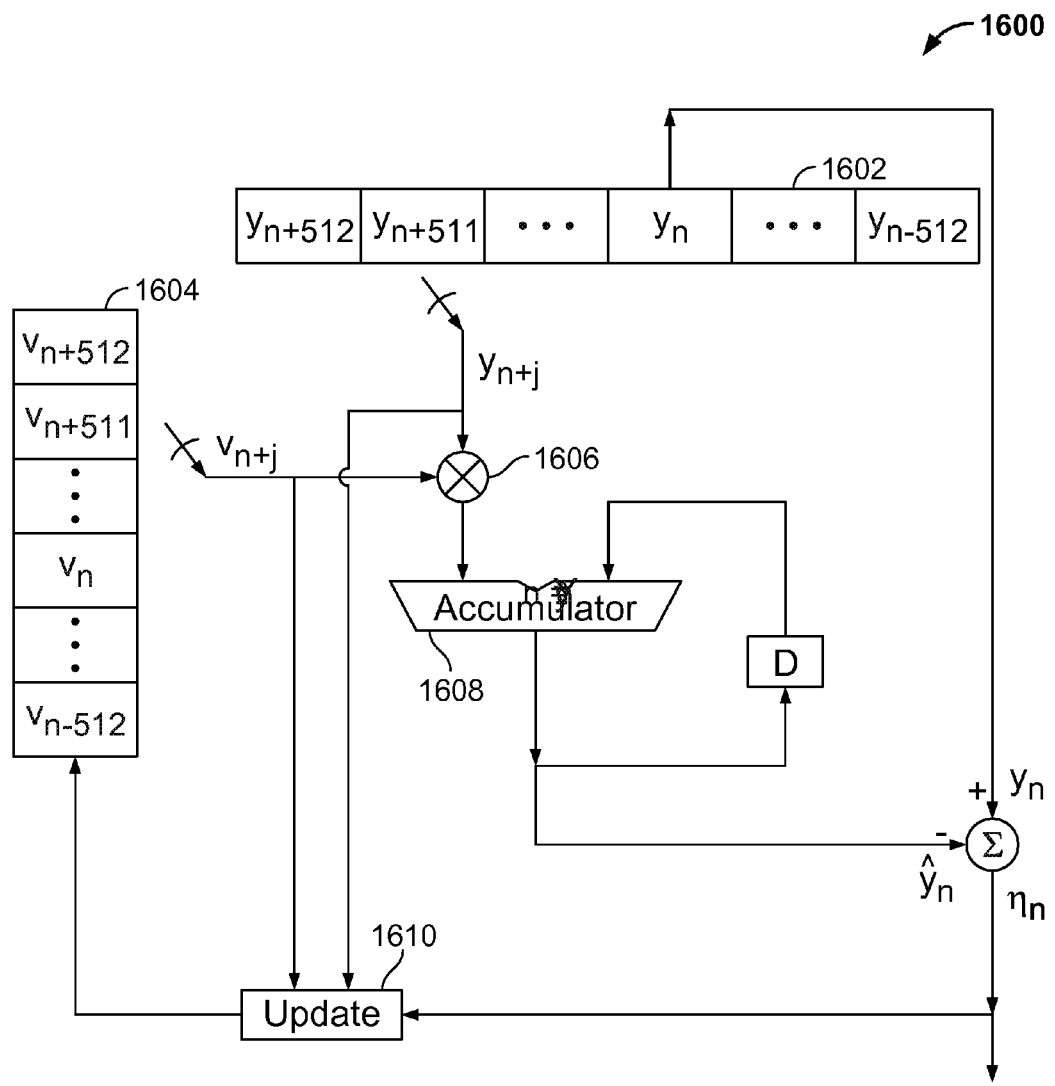
FIG. 16 is a block diagram illustrating an example implementation of a simplified persistence filter embodiment.

FIG. 16 is a block diagram illustrating an example implementation of a simplified persistence filter embodiment. In this example, filter 1600 includes a memory 1602, implemented as a delay line, that is configured to hold a total of 1025 input samples $y_{n+512}$ to $y_{n-512}$. The filter also includes a memory 1604 that stores a total of 1025 adaptable coefficients $v_{n+512}$ to $v_{n-512}$. The input samples and coefficients are selected sequentially. In some embodiments, a switch or a similar selector component is used to make the selection on each clock cycle. For example, $y_{n+512}$ and $v_{n+512}$ are selected at time t=0, $y_{n+511}$ and $v_{n+511}$ at time t=2, $y_{n+510}$ and $v_{n+510}$ at time t=3, etc. Multiplier 1606 multiplies a selected pair of $y_{n+i}$ and $v_{n+i}$ values. Unlike the dedicated multipliers 706 shown in FIG. 7, multiplier 1606 is referred to as a shared multiplier since it is shared by a number of $(y_{n+i}, v_{n+i})$ value pairs to carry out a plurality of input sample-coefficient multiplications sequentially over several clock cycles. The product is sent to an accumulator 1608, which accumulates the sum of the products over time, until all the $(y_{n+i}, v_{n+i})$ value pairs are computed and summed. In this example, 1025 samples will produce a single reference signal sample $\hat{y}_n$. $\hat{y}_n$ is compared with the value stored in the center tap of the delay line, $y_n$. The resulting error, which corresponds to the target nonlinear component $\eta_n$, is sent to an update block 1610 to update the coefficients.

Figure 17:
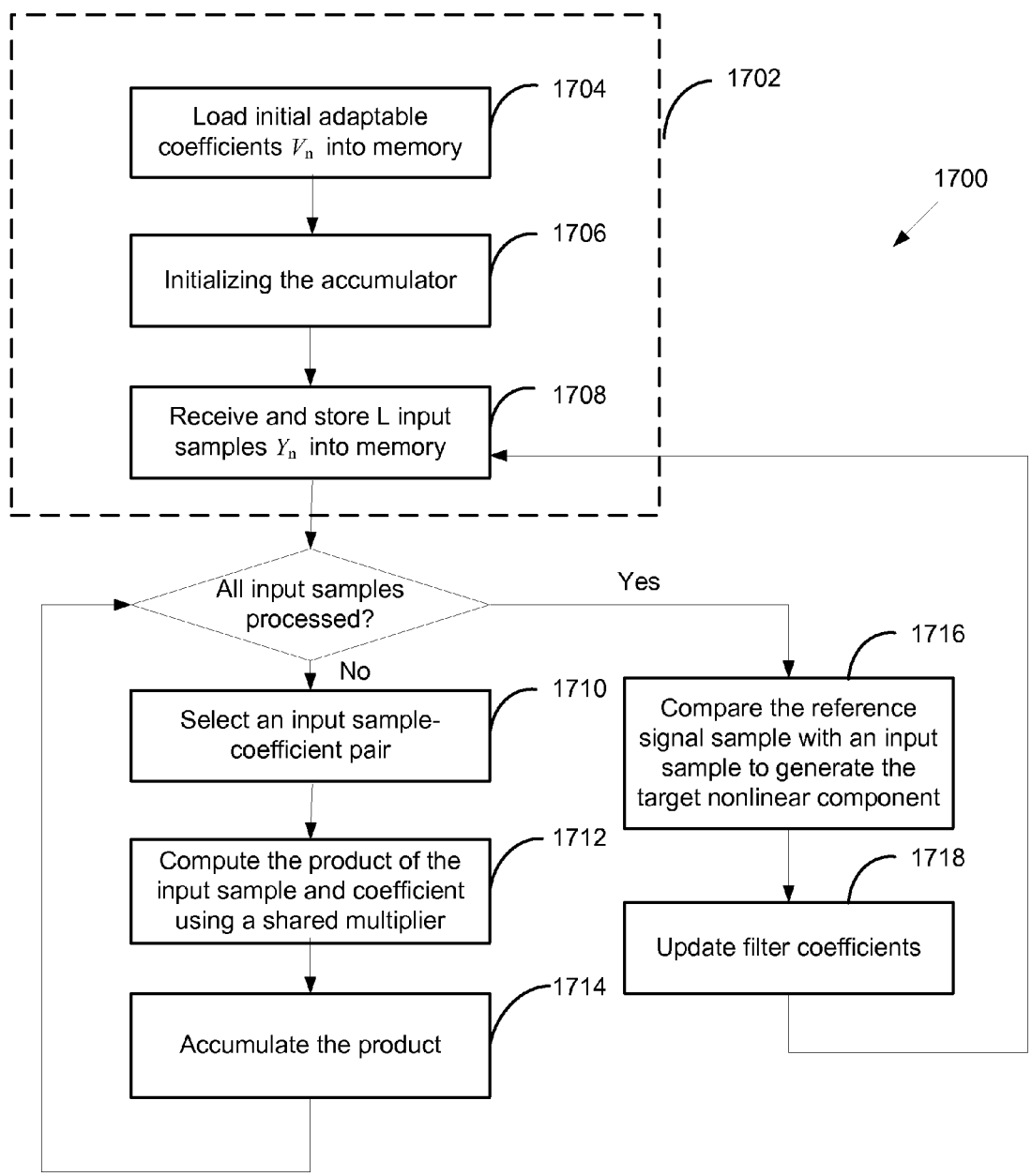
FIG. 17 is a flowchart illustrating an embodiment of a process for adapting a simplified persistence filter.

FIG. 17 is a flowchart illustrating an embodiment of a process for adapting a simplified persistence filter. Process 1700 may be implemented on a simplified persistence filter such as filter 1600 of FIG. 16. At the beginning of the process, the filter is initialized at step 1702. In this example, the initialization stage includes step 1704 initializing the accumulator such that its sum S is 0, step 1706 loading the initial adaptable coefficients $V_n$ into memory, and step 1708 receiving and storing L input samples $Y_n$ into memory. An input sample-coefficient pair is selected at step 1710. The product of the selected input sample and the coefficient is computed by a shared multiplier at step 1712. The product is accumulated, in other words added to the accumulator's sum at step 1714. Steps 1710-1714 repeat until all the input samples are processed, i.e., multiplied with a corresponding coefficient and their products accumulated. The sum of the accumulator is the reference signal sample $\hat{y}_n$. $\hat{y}_n$ is compared with the an input sample to generate the target nonlinear component $\eta_n$ at step 1716. In this example, the input sample is the center input sample $y_n$. At step 1718, the next set of coefficients $V_{n+1}$ are updated based on $\eta_n$, $V_n$, and $Y_n$. In some embodiments, the update step takes place while steps 1710-1714 are in progress. Once the coefficients are updated, the process returns to step 1708. The accumulator is reset and a new set of L input samples are loaded into memory.

Figure 18:
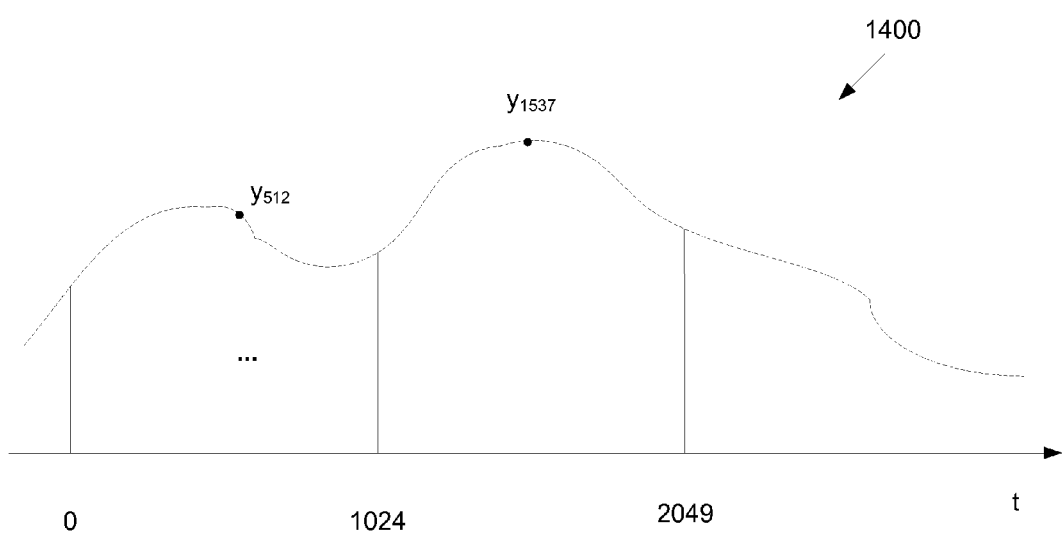
FIG. 18 is a signal diagram illustrating the operations of a simplified separation block employing a simplified persistence filter such as filter 1600.

FIG. 18 is a signal diagram illustrating the operations of a simplified separation block employing a simplified persistence filter such as filter 1600. In the diagram shown, L=1025. At time=0, the first processing cycle begins, where input samples $y_0$-$y_{1024}$ are multiplied with $v_0$-$v_{1024}$. The products are accumulated and compared with the center tap $y_{512}$ to produce a linear reference sample $\hat{y}_{512}$ and nonlinear target signal $\eta_{512}$. At time=1025, the second processing cycle begins and input samples $y_{1025}$-$y_{2049}$ are sequentially multiplied with a set of updated coefficients. The products are accumulated and compared with the new center tap $y_{512}$ to produce another reference sample $\hat{y}_{1536}$ and nonlinear target signal $\eta_{1536}$. Thus, the persistence filter produces output samples at a rate of 1/L of the input data rate. Although a lower data rate means that downstream processing components such as the DSP will converge more slowly, using a shared multiplier to generate a lower data rate output reduces chip complexity and power consumption.

Figure 19:
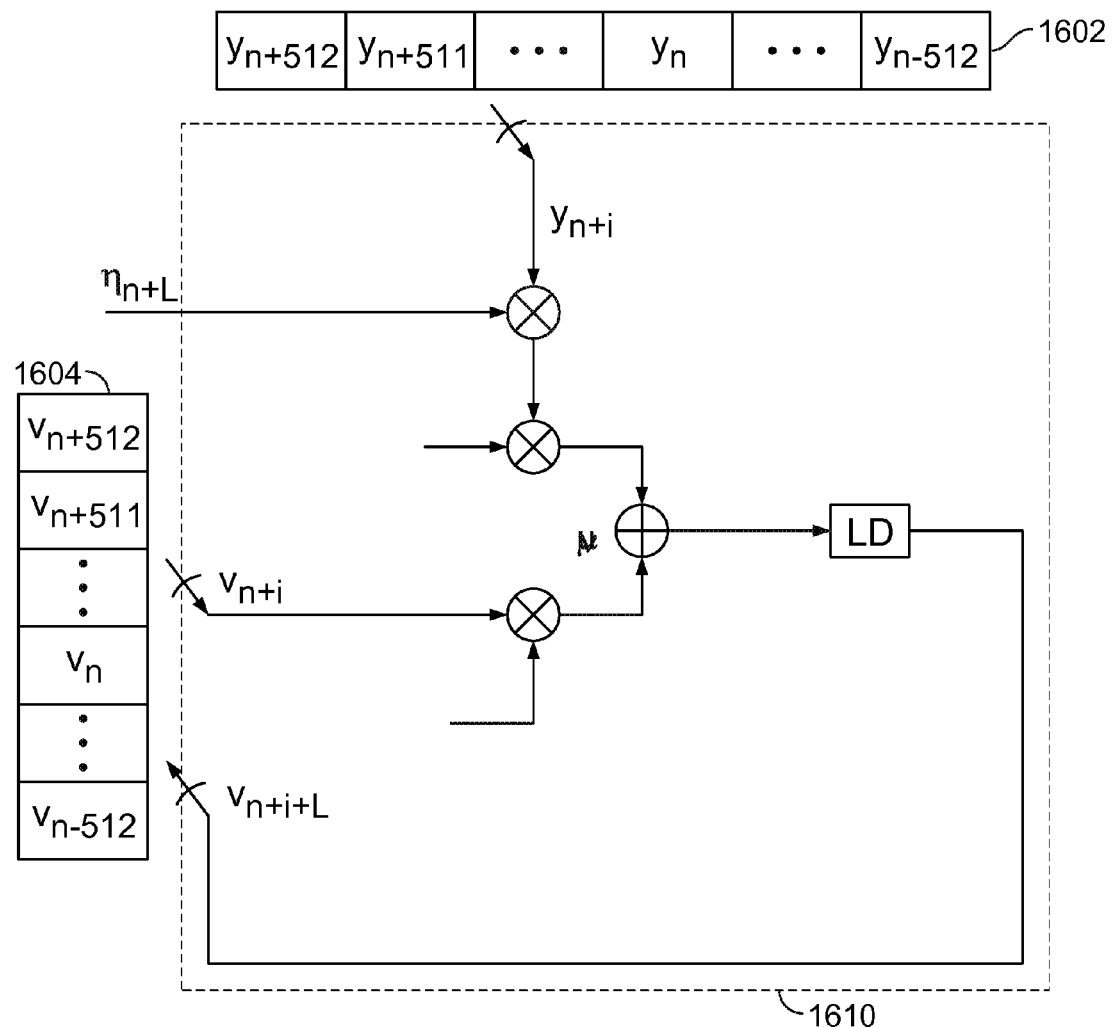
FIG. 19 is a block diagram illustrating an example implementation of update block 1610 of FIG. 16.

FIG. 19 is a block diagram illustrating an example implementation of update block 1610 of FIG. 16. In this example, update block 1610 updates the coefficients $v_i$ once for every L input samples. On each input clock cycle, the selected ($y_{n+i}$, $v_{n+i}$) pair and $\eta_{n+L}$ (i.e., $\eta_n$ generated during the previous processing cycle, based on the last L samples processed) are input to the update block. $y_{n+i}$ is multiplied with the adaptation step size $\mu$ and $\eta_{n+L}$, and $v_{n+i}$ is multiplied with the forgetting factor $v$. The results are summed by an adder, and then delayed by L clock cycles to generate $v_{n+L+i}$. A switch is used to update the storage location that currently stores the value $v_{n+i}$, with the new $v_{n+L+i}$ value.

Figure 20:
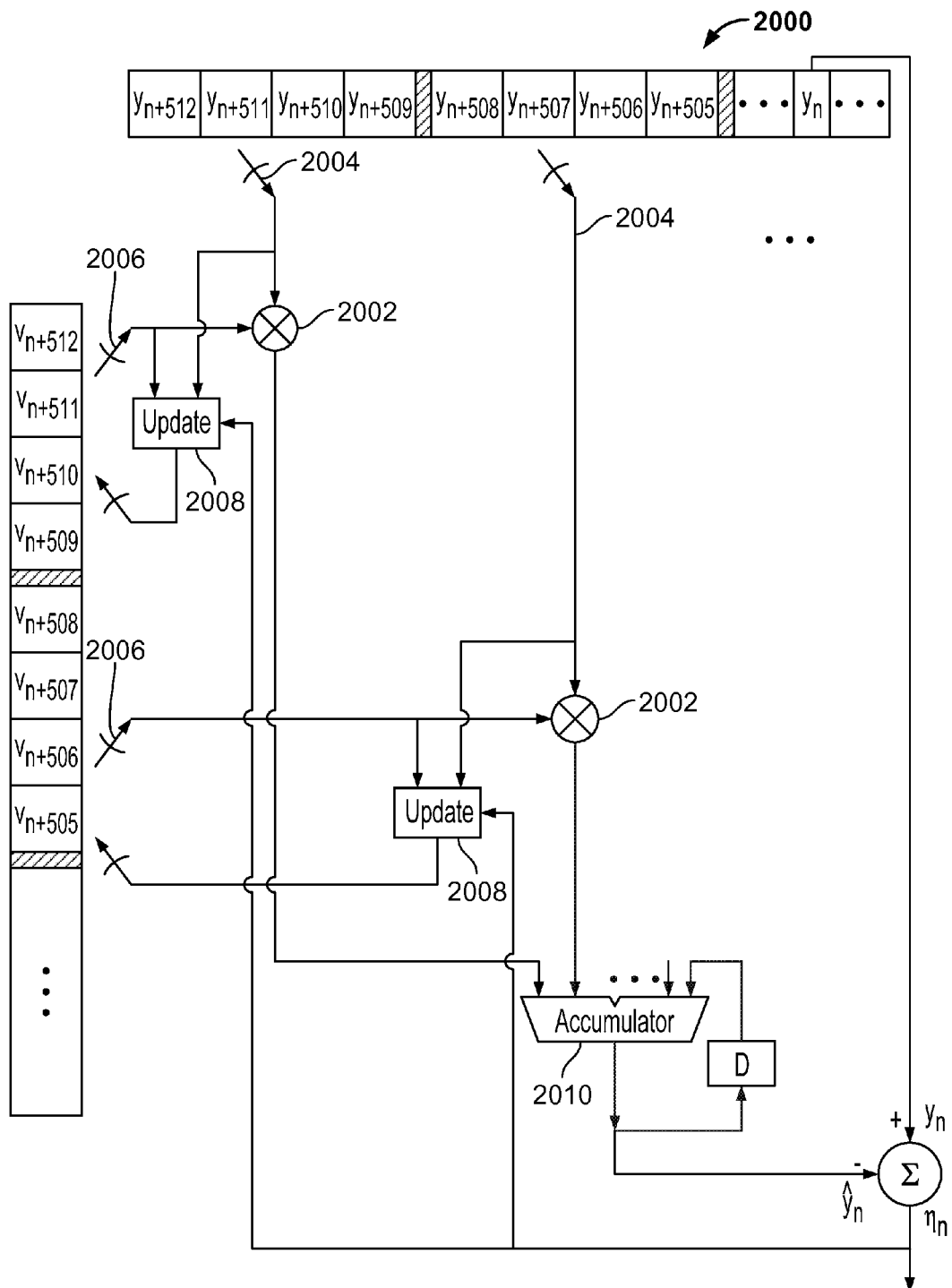
FIG. 20 is a block diagram illustrating another simplified persistence filter embodiment.

FIG. 20 is a block diagram illustrating another simplified persistence filter embodiment. In this example, persistence filter 2000 includes a plurality of shared operators. Each of the shared operators is used to operate on a subset of the input samples and adaptable coefficients. In the example, the shared operators include shared multipliers 2002 each configured to multiply k pairs of input samples with corresponding coefficients over k clock cycles. Switches 2004 and 2006 are used to select the appropriate input sample-coefficient pair on each clock cycle. The results are sent to accumulator 2010 to be summed. A reference signal sample $\hat{y}_n$ and a nonlinear target signal sample $\hat{\eta}_n$ are generated every k clock cycles. Each set of k coefficients are updated every k clock cycles via corresponding update blocks 2008. Update blocks 2008 may be implemented using structures similar to 1610 of FIG. 19, where k input samples and k coefficients from the appropriate memory locations are selectively sent to each update structure.

In the example shown, k=4. The number of shared multipliers may vary for different embodiments, and can be adjusted to increase or decrease the output rate, thereby fulfilling the timing requirements for convergence while minimizing power consumption and circuitry complexity.

Returning to FIGS. 15A and 15B, $y_n$ and $\eta_n$ are sent to an adaptive filter block, which includes an adaptive nonlinear DSP configured to adaptively achieve a filter transfer function that approximates the system distortion transfer function describing the nonlinear characteristics of the channel. In systems 1500 and 1550, for example, the DSP's inputs include the reference component $\hat{y}_n$ and a feedback error signal $e_n$ that is the difference between the target component $\eta_n$ and the DSP's output $\hat{\eta}_n$. The DSP is configured to use $\hat{y}_n$ as its input and $\eta_n$ as its training signal to adapt its filter coefficients and drive the error signal to a predetermined level.

The filter coefficients of the DSP's digital filters may be adapted using adaptive techniques including Least Mean Squares (LMS), Recursive Least Squares (RLS), or any other suitable adaptive techniques. The DSP adapts to implement a filter having a transfer function that is approximately the same as the nonlinear transfer function of the system, so that eventually the DSP's output $\hat{\eta}_n$ is about the same as $\eta_n$. In other words, the DSP's adapted transfer function is approximately the same as the transfer function describing the nonlinear relationship of the distorted component with respect to the undistorted component.

The error signal of the DSP is generally expressed as:

$$e_n = \eta_n - W_n^T \hat{Y}_n = \eta_n - \hat{\eta}_n \quad (20)$$

where $\hat{\eta}_n$ is the nonlinear distortion replica signal, $W_n^T = [w_n w_{n-1} \ldots w_{n-N+1} w_{n-N}]$ are the nonlinear coefficients and $\hat{Y}_n^T = [\hat{y}_n \hat{y}_{n-1} \ldots \hat{y}_{n-N+1} \hat{y}_{n-N}]$ is the nonlinear filter's input vector. In adaptive linearization module embodiments such as 600 and 1500, where the DSP is coupled to a separation block, the input vector of the DSP $\hat{Y}_n$ corresponds to the linear reference component of the separation block output.

The nonlinear coefficients of the DSP are expressed using the following general form:

$$w_n = a_n \hat{y}_n + b_n + \sum_{j=1}^{K} c_{j,n} |A_{j,n}^T \hat{Y}_n + \beta_{j,n}| \quad (21)$$

$$= a_n \hat{y}_n + b_n + \sum_{j=1}^{K} c_{j,n} (A_{j,n}^T \hat{Y}_n + \beta_{j,n}) \lambda_{j,n}$$

where $$\lambda_{j,n} = \text{sign}(A_{j,n}^T \hat{Y}_n + \beta_{j,n}) \quad (22)$$

$$\hat{Y}_n = [\hat{y}_{n-M} \hat{y}_{n+M-1} \ldots \hat{y}_n \ldots \hat{y}_{n-M-1} \hat{y}_{n-M}] \quad (23)$$

$$A_{j,n}^T [\alpha_{M,n} \alpha_{M-1,n} \ldots \alpha_{0,n} \ldots \alpha_{-M+1,n} \alpha_{-M,n}] \quad (24)$$

Coefficients $\alpha_{j,n}$, $\beta_{j,n}$, $c_{j,n}$, and $\lambda_{j,n}$ have a time index n because the filter is adaptive and therefore time-varying. The starting values for the coefficients may be 0 or any small random number. The nonlinear coefficients are adapted as follows:

$$A_{j,n+1}^T = A_{j,n}^T + \mu c_{j,n} \lambda_{j,n} \hat{Y}_n e_n \hat{y}_n \quad (25)$$

$$\beta_{j,n+1} = \beta_{j,n} + \mu c_{j,n} \lambda_{j,n} e_n \hat{y}_n \quad (26)$$

$$c_{j,n+1} = c_{j,n} + \mu |A_{j,n}^T \hat{Y}_n + \beta_{j,n}| e_n \hat{y}_n \quad (27)$$

$$a_{j,n+1} = a_{j,n} + \mu \hat{y}_n e_n \hat{y}_n \quad (28)$$

$$b_{j,n+1} = b_{j,n} + \mu e_n \hat{y}_n \quad (29)$$

Figure 21:
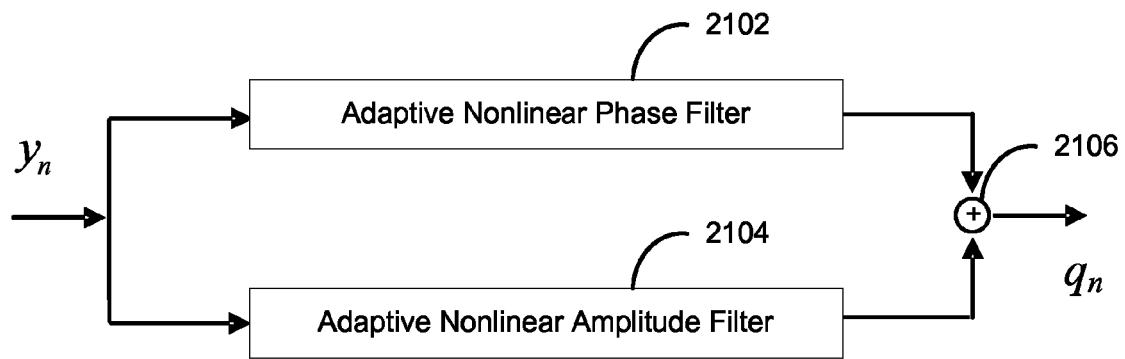
FIG. 21 is a block diagram illustrating an embodiment of a simplified adaptive DSP.

FIG. 21 is a block diagram illustrating an embodiment of a simplified adaptive DSP. In this example, DSP 2100 includes a nonlinear adaptive phase filter 2102 and a nonlinear adaptive amplitude filter 2104. Both filters receive the same input, and the outputs of the filters are combined using a combiner 2106. The nonlinear adaptive phase filter is an adaptive filter whose amplitude response is approximately constant over time, but whose phase response varies over time. The nonlinear adaptive amplitude filter is an adaptive filter whose amplitude response is time-varying, but whose phase response stays approximately constant over time. Thus, the resulting combined filter 2100 has both a time-varying phase response and a time-varying amplitude response. A desired filter transfer function can be achieved by adjusting the transfer function of filter 2102, 2104, or both.

Figure 22:
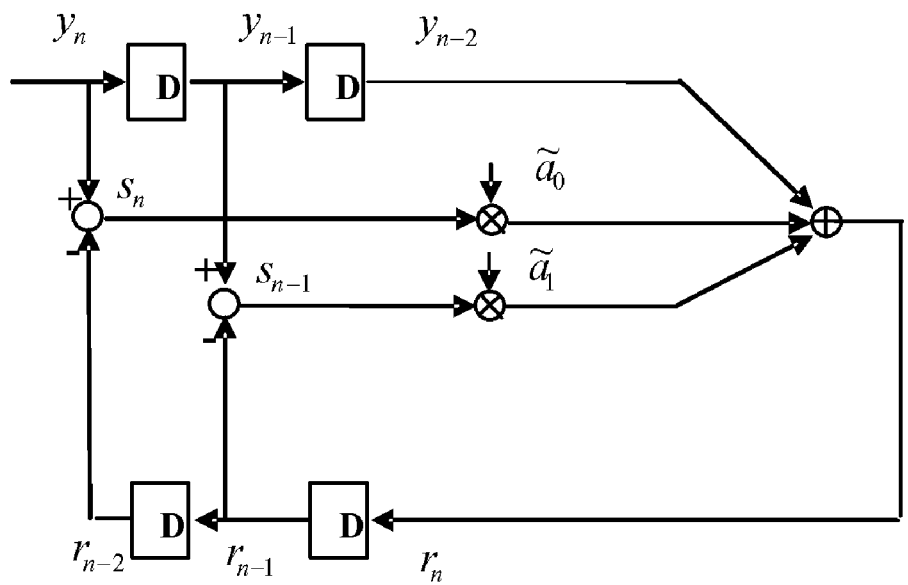
FIG. 22 is a block diagram illustrating an embodiment of a nonlinear adaptive phase filter.

FIG. 22 is a block diagram illustrating an embodiment of a nonlinear adaptive phase filter. In this example, nonlinear phase filter 2200 is an infinite impulse response (IIR) filter. As will be described in more detail below, coefficients $\tilde{a}_0$, $\tilde{a}_1, \ldots, \tilde{a}_k$ are nonlinear functions of appropriate feed-forward and feedback signals in the filter. In the example shown, only $\tilde{a}_0$ and $\tilde{a}_1$ are used. The filter structure produces only phase effects, and the filter output $r_n$ has a phase that varies as a nonlinear function of the signal and its history.

An IIR filter has a flat amplitude response and a non-uniform phase response if its z-domain transfer function takes the form $$H(z) = \frac{a_0 + a_1 z^{-1} + a_2 z^{-2}}{a_2 + a_1 z^{-1} + a_0 z^{-2}} \qquad (30)$$

or more simply $$H(z) = \frac{a_0 + a_1 z^{-1} + z^{-2}}{1 + a_1 z^{-1} + a_0 z^{-2}}. \qquad (31)$$

The time domain function of such an IIR filter is $$\begin{aligned} r_n &= a_0 y_n + a_1 y_{n-1} + y_{n-2} - a_1 r_{n-1} - a_0 r_{n-2} \\ &= y_{n-2} + a_0(y_n - r_{n-2}) + a_1(y_{n-1} - r_{n-1}). \end{aligned} \qquad (32)$$

To achieve the desired nonlinear phase effect, IIR filter 2200 is configured to operate according to the following time domain function:

$$r_n = y_{n-2} + \tilde{a}_0(y_n - r_{n-2}) + \tilde{a}_1(y_{n-1} - r_{n-1}) \qquad (33)$$

where each coefficient at is $\tilde{a}_k$ nonlinear function of the input signal.

One way of implementing the nonlinear coefficients $\tilde{a}_k$ is $$\begin{aligned} \tilde{a}_{k,n} &= a_{k,n} S_n + b_{k,n} + \sum_{j=1}^{K} c_{j,n}^k \left| A_{j,n}^{k\,T} S_n + \beta_{j,n}^k \right| \\ &= a_{k,n} S_n + b_{k,n} + \sum_{j=1}^{K} c_{j,n}^k \left( A_{j,n}^{k\,T} S_n + \beta_{j,n}^k \right) \lambda_{j,n}^k \end{aligned} \qquad (34)$$

where $\lambda_{j,n}^k = \text{sign}(A_{j,n}^{k\,T} S_n + \beta_{j,n}^k)$ and $S_n = [(y_n - r_{n-L})_{(jn-1} - r_{n+L+1}) \ldots]$.

Other forms can be used, and any nonlinear function will result in a nonlinear phase filter with infinite time memory because the filter is an IIR filter. Coefficients of the nonlinear filter are updated as follows:

$$A_{j,n+1}^{k\,T} = A_{j,n}^{k\,T} + \mu c_{j,n}^k \lambda_{j,n}^k S_n e_n S_n \qquad (35)$$

$$\beta_{j,n+1}^k = \beta_{j,n}^k + \mu c_{j,n}^k \lambda_{j,n}^k e_n S_n \qquad (36)$$

$$c_{j,n+1}^k = c_{j,n}^k + \mu | A_{j,n}^{k\,T} S_n + \beta_{j,n}^k | e_n s \qquad (37)$$

$$a_{k,n+1} = a_{k,n} + \mu x_n e_n S_n \qquad (38)$$

$$b_{k,n+1} = b_{k,n} + \mu e_n S_n \qquad (39)$$

The above example shows an order-2 filter. In some embodiments, filters of order N are implemented based on the same principle. Such a filter has a generalized time domain form of:

$$r_n = \tilde{a}_0(y_n - r_{n-N}) + \tilde{a}_1(y_{n-1} - r_{n-N+1}) + \ldots + y_{n-N} \qquad (40)$$

In some embodiments, nonlinear adaptive amplitude filter 2104 of FIG. 21 is implemented using a finite impulse response (FIR) filter to provide a time-varying amplitude response and a phase response that is approximately constant over time. The FIR filter may be implemented using any suitable techniques, such as the low complexity filter implementation techniques described in U.S. patent application Ser. No. 11/061,850 by Batruni entitled "LOW COMPLEXITY NONLINEAR FILTERS", which is incorporated by reference for all purposes.

In some embodiments, a simplified form of the FIR filter is expressed as:

$$u_n = \sum_{i=0}^{M} \tilde{w}_i y_{n-i} \qquad (41)$$

wherein the coefficients $\tilde{w}_i$ are time-varying functions of the input signal. The general expression is of order M. For purposes of illustration, examples of order 2 FIRs that depend on three consecutive input samples are discussed below.

In some embodiments, the coefficients of a simplified filter are described as follows:

$$\begin{aligned} \tilde{w}_{k,n} &= a_{k,n} y_n + b_{k,n} + \sum_{j=1}^{K} c_{j,n}^k \left| A_{j,n}^{k\,T} Y_n + \beta_{j,n}^k \right| \\ &= a_{k,n} y_n + b_{k,n} + \sum_{j=1}^{K} c_{j,n}^k \left( A_{j,n}^{k\,T} Y_n + \beta_{j,n}^k \right) \lambda_{j,n}^k \end{aligned} \qquad (42)$$

where K is the number of sub-filters in the nonlinear filter.

$$\lambda_{j,n}^k = \text{sign}(A_{j,n}^{k\,T} Y_n + \beta_{j,n}^k) \qquad (43)$$

$$Y_n [y_{n+M} y_{n+M-1} \ldots y_n \ldots y_{n-M+1} y_{n-M}] \qquad (44)$$

$$\begin{aligned} A_{j,n}^{k\,T} &= [\alpha_{j,M,n}^k \alpha_{j,M-1,n}^k \ldots \alpha_{j,0,n}^k \ldots \alpha_{j,-M+1,n}^k \\ &\quad \alpha_{j,-M,n}^k] \end{aligned} \qquad (45)$$

The coefficients shown in this example have a time index n because they are updated over time and therefore are time-varying. Thus, the resulting adaptive filter has a time-varying nonlinear transfer function. The initial starting values for the coefficients can be random. In some embodiments small starting values are used to allow the filter to converge without introducing a great deal of noise during the process.

The coefficients of the simplified filter are updated as follows:

$$A_{j,n+1}^{k\,T} = A_{j,n}^{k\,T} + \mu c_{j,n}^k \lambda_{j,n}^k Y_n e_n y_n \qquad (46)$$

$$\beta_{j,n+1}^k = \beta_{j,n}^k + \mu c_{j,n}^k \lambda_{j,n}^k e_n y_n \qquad (47)$$

$$c_{j,n+1}^k = c_{j,n}^k + \mu | A_{j,n}^{k\,T} Y_n + \beta_{j,n}^k | \qquad (48)$$

$$a_{k,n+1} = a_{k,n} + \mu y_n e_n y_n \qquad (49)$$

$$b_{k,n+1} = b_{k,n} + \mu e_n y_n \qquad (50)$$

In some embodiments, the coefficients of a simplified filter are described as follows:

$$\tilde{w}_{k,n} = a_{k,n}y_n + b_{k,n} + \sum_{j=1}^{K} c_{j,n}^k \operatorname{sign}\left(A_{j,n}^{k\,T} Y_n + \beta_{j,n}^k\right) \quad (51)$$

$$= a_{k,n}y_n + b_{k,n} + \sum_{j=1}^{K} c_{j,n}^k \lambda_{j,n}^k$$

where $$\lambda_{j,n}^k = \operatorname{sign}(A_{j,n}^{k\,T} Y_n + \beta_{j,n}^k) \quad (52)$$

$$Y_n[y_{n+M} y_{n+M-1} \ldots y_n \ldots y_{n-M+1} y_{n-M}] \quad (53)$$

$$A_{j,n}^{k\,T} = [\alpha_{j,M,n}^k \alpha_{j,M-1,n}^k \ldots \alpha_{j,0,n}^k \ldots \alpha_{j,-M+1,n}^k \alpha_{j,-M,n}^k] \quad (54)$$

The coefficients, which have a time index n, are time-varying, as is the filter transfer function of the resulting adaptive nonlinear filter.

The initial values of the filter coefficients may be chosen as small, random values. The filter coefficients are updated as follows:

$$c_{j,n+1}^k = c_{j,n}^k + \mu \lambda_{j,n}^k e_n y_n \quad (55)$$

$$a_{k,n+1} = a_{k,n} + \mu y_n e_n y_n \quad (56)$$

$$b_{k,n+1} = b_{k,n} + \mu e_n y_n \quad (57)$$

In some embodiments, another type of simplified FIR filter having the following form is used:

$$u_n = \tilde{w}_0 + \tilde{w}_1 + \tilde{w}_2 \quad (58)$$

where the coefficients are nonlinear functions of the input signal and its history. The input signal itself, however, is not multiplied by the coefficients. The coefficients are expressed as:

$$\tilde{w}_{k,n} = a_{k,n}y_n + b_{k,n} + \sum_{j=1}^{K} c_{j,n}^k \operatorname{sign}\left(A_{j,n}^{k\,T} Y_n + \beta_{j,n}^k\right) \quad (59)$$

$$= a_{k,n}y_n + b_{k,n} + \sum_{j=1}^{K} c_{j,n}^k \lambda_{j,n}^k$$

where $$\lambda_{j,n}^k = \operatorname{sign}(A_{j,n}^{k\,T} Y_n \beta_{j,n}^k) \quad (60)$$

$$Y_n[y_{n+M} y_{n+M-1} \ldots y_n \ldots y_{n-M+1} y_{n-M}] \quad (61)$$

$$A_{j,n}^{k\,T} = [\alpha_{j,M,n}^k \alpha_{j,M,n}^k \ldots \alpha_{j,0,n}^k \ldots \alpha_{j,-M+1,n}^k \alpha_{j,-M,n}^k] \quad (62)$$

The coefficients are updated as follows:

$$c_{j,n+1}^k = c_{j,n}^k + \mu \lambda_{j,n}^k e_n \quad (63)$$

$$a_{k,n+1} = a_{k,n} + \mu y_n e_n \quad (64)$$

$$b_{k,n+1} = b_{k,n} + \mu e_n \quad (65)$$

The coefficients have a time index n because the filter is adaptive and therefore time-varying. The coefficients' initial values are small, random numbers.

Adaptive self-linearization of an unknown distorted signal has been described. The techniques described are generally applicable to nonlinear systems. The methods described may be implemented using filters, DSPs, as well as implemented as computer code that operates on general purpose processors such as MATLAB™ programs.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A digital signal processor (DSP) comprising:
    an input terminal configured to receive an input;
    an adaptive nonlinear phase filter coupled to the input terminal, the adaptive nonlinear phase filter having a time-varying phase response; and
    an adaptive nonlinear amplitude filter coupled to the input terminal, the adaptive nonlinear amplitude filter having a time-varying amplitude response.

2. The DSP of claim 1, further comprising a combiner to combine the output of the adaptive nonlinear phase filter and the output of the adaptive nonlinear amplitude filter.

3. The DSP of claim 1, wherein the adaptive nonlinear phase filter has an amplitude response that is approximately constant over time.

4. The DSP of claim 1, wherein the adaptive nonlinear amplitude filter has a phase response that is approximately constant over time.

5. The DSP of claim 1, wherein the adaptive nonlinear phase filter includes an infinite impulse response (IIR) filter.

6. The DSP of claim 1, wherein the adaptive nonlinear phase filter includes an infinite impulse response (IIR) filter whose time domain function is $r_n \tilde{a}_0(y_n - r_{n-N}) + \tilde{a}_1(y_{n-1} - r_{n-N+1}) + \ldots + y_{n-N}$.

7. The DSP of claim 1, wherein the adaptive nonlinear amplitude filter includes a finite impulse response (FIR) filter.

8. The DSP of claim 7, wherein the FIR filter has a filter coefficient that is a time-varying function of the input to the FIR filter.

9. The DSP of claim 7, wherein the FIR filter has the form $$u_n = \sum_{i=0}^{M} \tilde{w}_i y_{n-i},$$

wherein $\tilde{w}$ is a time-varying function of the input signal.

10. The DSP of claim 8, wherein the time-varying function is a first order function of the input to the FIR filter.

11. A method for processing a signal, comprising:
    receiving the signal as an input to a digital signal processor (DSP);
    sending the signal to an adaptive nonlinear phase filter, the adaptive nonlinear phase filter having a time-varying phase response; and
    sending the signal to an adaptive nonlinear amplitude filter, the adaptive nonlinear amplitude filter having a time-varying amplitude response.

12. The method of claim 11, further comprising combining the output of the adaptive nonlinear phase filter and the output of the adaptive nonlinear amplitude filter.

13. The method of claim 11, wherein the adaptive nonlinear phase filter has an amplitude, response that is approximately constant over time.

14. The method of claim 11, wherein the adaptive nonlinear amplitude filter has a phase response that is approximately constant over time.

15. The method of claim 11, wherein the adaptive nonlinear phase filter includes an infinite impulse response (IIR) filter.

16. The method of claim 11, wherein the adaptive nonlinear phase filter includes an infinite impulse response (IIR) filter whose time domain function is $$r_n \tilde{a}_0 (y_n - r_{n-N}) + \tilde{a}_1 (y_{n-1} - r_{n-N+1}) + \ldots + y_{n-N}.$$

17. The method of claim 11, wherein the adaptive nonlinear amplitude filter includes a finite impulse response (FIR) filter.

18. The method of claim 17, wherein the FIR filter has a filter coefficient that is a time-varying function of the input to the FIR filter.

19. The method of claim 17, wherein the FIR filter has the form $$u_n = \sum_{i=0}^{M} \tilde{w}_i y_{n-i},$$

wherein $\tilde{w}_i$ is a time-varying function of the input signal.

20. The method of claim 18, wherein the time-varying function is a first order function of the input to the FIR filter.

21. A computer program product for processing a signal, the computer program product being embodied in a computer readable medium and comprising computer instructions for:

receiving the signal;

sending the signal to an adaptive nonlinear phase filter, the adaptive nonlinear phase filter having a time-varying phase response; and sending the signal to an adaptive nonlinear amplitude filter, the adaptive nonlinear amplitude filter having a time-varying amplitude response.

* * * * *